(12) United States Patent
Miwa et al.

(10) Patent No.: US 6,829,034 B2
(45) Date of Patent: Dec. 7, 2004

(54) EXPOSURE APPARATUS AND DEVICE MANUFACTURING METHOD

(75) Inventors: Yoshinori Miwa, Utsunomiya (JP); Eiji Sakamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/819,671

(22) Filed: Mar. 29, 2001

(65) Prior Publication Data

US 2001/0055326 A1 Dec. 27, 2001

(30) Foreign Application Priority Data

Mar. 30, 2000 (JP) ........................................ 2000-093958

(51) Int. Cl.[7] ..................... G03B 27/52; G03B 27/32; H01S 3/08; A61N 5/00; G02B 7/02
(52) U.S. Cl. ........................ 355/30; 355/51; 355/52; 355/53; 355/55; 355/67; 355/77; 372/98; 372/101; 250/492.2; 250/441.11; 359/507; 359/513; 359/820
(58) Field of Search ............................. 355/30, 51, 52, 355/53, 55, 67, 77; 372/98, 101; 250/492.2, 441.11; 359/507, 513, 820

(56) References Cited

U.S. PATENT DOCUMENTS

| | | | |
|---|---|---|---|
| 4,690,528 A | 9/1987 | Tanimoto et al. ........... 353/101 |
| 4,701,606 A | 10/1987 | Tanimoto et al. ........... 250/201 |
| 4,704,348 A | 11/1987 | Koizumi et al. ............ 430/327 |
| 4,786,947 A | 11/1988 | Kosugi et al. ................ 355/30 |
| 4,825,247 A | 4/1989 | Kemi et al. .................... 355/55 |
| 4,969,168 A | 11/1990 | Sakamoto et al. ............ 378/34 |
| 5,063,582 A | 11/1991 | Mori et al. .................... 378/34 |
| 5,093,579 A | 3/1992 | Amemiya et al. ........ 250/453.1 |
| 5,138,643 A | 8/1992 | Sakamoto et al. ............ 378/34 |
| 5,223,453 A | * 6/1993 | Sopori |
| 5,231,291 A | 7/1993 | Amemiya et al. ........ 250/443.3 |
| 5,407,867 A | * 4/1995 | Iwasaki et al. |
| 5,696,623 A | * 12/1997 | Fujie et al. |
| 5,812,242 A | * 9/1998 | Tokuda |
| 5,838,426 A | 11/1998 | Shinonaga et al. ........... 355/52 |
| 5,883,704 A | * 3/1999 | Nishi et al. |
| 5,892,572 A | * 4/1999 | Nishi |
| 5,981,075 A | * 11/1999 | Ohmi et al. |
| 6,259,509 B1 | * 7/2001 | Miwa et al. |
| 6,322,756 B1 | * 11/2001 | Arno et al. |
| 6,341,006 B1 | * 1/2002 | Murayama et al. |
| 6,342,312 B2 | * 1/2002 | Oba et al. |
| 6,630,985 B2 | 10/2003 | Hase ........................... 355/30 |

FOREIGN PATENT DOCUMENTS

JP  6-216000  8/1994

OTHER PUBLICATIONS

U.S. patent application Ser. No. 09/145,983, filed Sep. 3, 1998.

* cited by examiner

Primary Examiner—Sandra O'Shea
Assistant Examiner—Khaled Brown
(74) Attorney, Agent, or Firm—Fitzpatrick, Cella, Harper & Scinto

(57) ABSTRACT

An exposure apparatus to be used with an excimer laser as a light source includes an optical system disposed along a path of excimer laser light, a chamber for accommodating the optical system therein and having an inside space being able to be replaced by a predetermined gas, a gas circulation mechanism having a gas circulation path for connecting a gas discharging port for discharging a gas from the chamber and a gas supplying port for supplying a gas into the chamber, and a switching device for selectively using plural purifiers disposed in the gas circulation path.

51 Claims, 13 Drawing Sheets

| URL | http://www.maintain.co.jp./db/input.html |

TROUBLE DB INPUT WINDOW

DATE `2000/3/15` ~404
MACHINE `*********` ~401
FILE `OPE. FAILURE (STARTING ERROR)` ~403
S.N. S/N `465NS4580001` ~402
EMERGENCY `D` ~405
STATE `LED FLICKERING AFTER POWERED` ~406

SOLUTION `RESTART:PRESS RED BUTTON` ~407

PROGRESS `TEMPORARY SOLUTION DONE` ~408

[NEXT] [RESET]   ~410         ~411          ~412
LINK TO RESULT       SOFTWARE       OPERATION
LIST DATABASE        LIBRARY        GUIDE

FIG. 14

EXPOSURE APPARATUS AND DEVICE MANUFACTURING METHOD

FIELD OF THE INVENTION AND RELATED ART

This invention relates to an exposure apparatus which uses vacuum ultraviolet rays having a wavelength not longer than 160 nm, as an exposure beam. Also, the invention concerns a semiconductor device manufacturing method or a semiconductor manufacturing factory using such an exposure apparatus, or a maintenance method therefor.

In projection exposure apparatus for the manufacture of semiconductor integrated circuits, light of various wavelength regions is projected to a substrate as an exposure beam. As regards the exposure beam, for example, g-line (436 nm), i-line (365 nm), a KrF excimer laser (248 nm) or an ArF excimer laser (193 nm) is used.

The exposure beam emitted from a light source is directed through an illumination optical system for illuminating a reticle (or mask) and a projection optical system (projection lens) for imaging a fine pattern formed on the reticle upon a substrate such as a semiconductor wafer substrate, for example, by which the fine pattern is lithographically transferred to a photosensitive substrate. In such conventional exposure apparatuses, further improvements in throughput and resolution are required to meet further miniaturization of the pattern linewidth. In this connection, an exposure beam having a higher power is desired and, on the other hand, the shortening of the wavelength of the exposure beam is required.

The pattern linewidth of next generation semiconductor integrated circuits will be about 100 to 70 nm. As regards the exposure beam wavelength region, an $F_2$ excimer laser having a wavelength of 157 nm, shorter than that of an ArF excimer laser, is expected.

However, it is known that, when a short wavelength exposure beam of an i-line or one shorter than it is used, the short wavelength exposure beam causes a photochemical reaction of impurities and oxygen in the air. The product of such a reaction is deposited on an optical element (lens or mirror) of the optical system to cause a decrease in characteristics such as optical efficiency, for example. This leads to a decrease in throughput of the exposure apparatus.

As regards the product, representative examples are ammonium sulfate $(NH_4)_2O_4$ to be produced, when sulfurous acid $SO_2$ absorbs light energy and is excited thereby, through reaction (oxidation) of the same with oxygen in the air, and $SiO_2$ to be produced, when a Si compound absorbs light energy and is excited thereby, through reaction of the same with oxygen in the air.

Conventionally, in order to avoid such a product, an optical system is purged by an inactive gas. For example, Japanese Laid-Open Patent Application, Laid-Open No. 216000/1994 shows an apparatus wherein a barrel having glass members such as lenses accommodated therein is placed in a housing of a closed structure and wherein the inside of the barrel is filled with an inactive gas.

In ArF excimer lasers having an emission wavelength of about 193 nm, there are plural oxygen $(O_2)$ absorption bands in this wavelength region. The inactive gas purging is performed to an optical system to hold the oxygen concentration in the optical path at a very low level and, on the other hand, the purity of the emission wavelength is increased to provide a wavelength of very small absorption, as an exposure beam.

When $F_2$ excimer lasers are used for an exposure process, the following problems arise:

It is known that, in the vacuum ultraviolet region near 157 nm, there is a continuous absorption band to oxygen. The characteristic differs from the region in which an absorption band near 193 nm (ArF excimer laser) is present discontinuously. It is, therefore, impossible to choose an exposure wavelength of very small absorption, as an ArF excimer laser.

Further, it is known that, in the vacuum ultraviolet region near 157 nm, there is a continuous water vapor absorption band, which is absent near 193 nm.

In addition thereto, it is known that vacuum ultraviolet rays near 157 nm are easily absorbed by ammonia $(NH_3)$, carbon dioxide $(CO_2)$ or an organic gas, for example. Thus, the light absorption along the exposure light path, which may be disregarded in the conventional exposure process using ultraviolet rays not longer than 160 nm, increases very much. This may cause a large decrease of the throughput of the apparatus.

A chemical filter may be used to prevent the supply of such a light absorptive material into the apparatus. However, replacement filters or maintenance thereof requires stopping the operation. This may cause a decrease of the throughput of the apparatus.

Further, when the concentration of such a light absorptive material in the light path changes during the exposure operation, a change (error) occurs in the actual exposure amount relative to a desired exposure amount. This may cause not only a decrease of the throughput but also a large decrease of the exposure amount control precision.

Furthermore, for exposure of a pattern linewidth of 100 to 70 nm, deformation of the apparatus due to a temperature change should be reduced to a low level, to improve the pattern overlay precision. Additionally, reduction of a measurement error due to any fluctuation of various measuring systems accommodated in the apparatus or reduction of changes in characteristic of the optical system due to a temperature change, have to be accomplished as well.

Therefore, the environment control related to the optical path gas components, from the standpoints of efficiency of the optical system, the exposure amount control and the product deposition to the optical system, on one hand, as well as the temperature control of the exposure apparatus from the standpoints of thermal deformation, fluctuation of measuring systems and optical characteristics, on the other hand, should be accomplished simultaneously. In conventional exposure apparatus, both the environment control and the temperature control such as described above are not satisfactorily accomplished.

SUMMARY OF THE INVENTION

It is accordingly an object of the present invention to provide an exposure apparatus and/or a device manufacturing method using the same, by which the gas purity in an ambience can be maintained to assure an exposure process of higher throughput.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 14 is a schematic view of a display screen of a display unit.

DESCRIPTION OF THE PREFERRED EMBODIMENTS

Preferred embodiments of the present invention will now be described with reference to the accompanying drawings.

Embodiment 1

Figure 1:
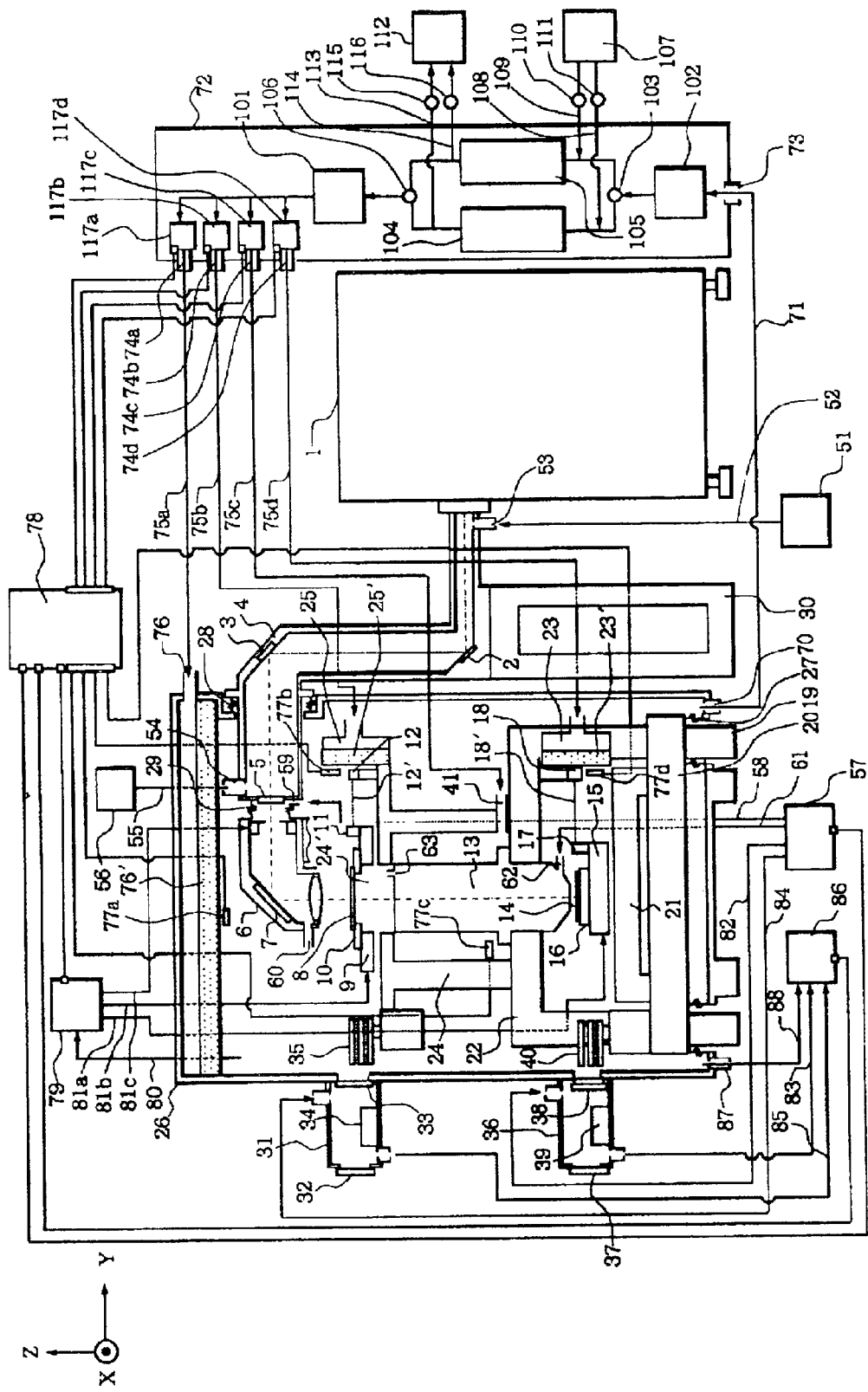
FIG. 1 is a schematic view of a general structure of an exposure apparatus according to a first embodiment of the present invention.

FIG. 1 is a schematic view of a general structure of an exposure apparatus according to an embodiment of the present invention.

In the drawing, a laser unit 1, which is a light source of the exposure apparatus, is disposed on a floor or a room downstairs, separately from the exposure apparatus. The laser unit 1 comprises an excimer laser device for producing vacuum ultraviolet light of a wavelength region not longer than 160 nm. In this embodiment, an $F_2$ laser having an emission wavelength of about 157 nm is used. However, in place of it, an $Ar_2$ laser having an emission wavelength of about 126 nm or any other light source for emitting a wavelength in the ultraviolet region as such may be used.

The laser beam emitted from the laser unit 1 is introduced into the main assembly of the exposure apparatus, by way of mirrors 2 and 3. A chamber 4 has a tightly closed structure for isolating components around the light path, including the mirrors 2 and 3, against the outside atmosphere. There is a glass member 5 mounted at the light exit port of the chamber 4. This glass member serves to transmit the laser beam from the laser unit 1 therethrough and to introduce the same into a housing 6, to be described later. Further, the glass member 5 functions to keep the closed state of the chamber 4 and also to spatially separate the chamber 4 and the housing 6 from each other.

The glass member 5 is made of a glass material of fluorine compound. More specifically, any one of fluoride ($CaF_2$), magnesium fluoride ($MgF_2$), barium fluoride ($BaF_2$), $SrF_2$, and fluorine doped quartz may be used. These glass materials have a high transmission factor to light of a wavelength not longer than 157 nm.

Details of the chamber 4 will be described later.

The light passing through the glass member 5 enters the housing 6 and, through a mirror 7 inside the housing 6, it illuminates a reticle 8. Details of the housing 6 will be described later, too.

The reticle 8 is placed on a reticle holder 10, which is mounted on a reticle stage 9. The reticle stage 9 is made movable, by means of a reticle stage driving system (not shown), in the Y direction (scan direction) along a plane orthogonal to the optical axis. There is a bar mirror 11 fixed to the reticle stage 9. It cooperates with an interferometer 12 for measuring the bar mirror position, to measure the position of the reticle stage 9. In FIG. 1, only one interferometer 12 is illustrated, and the stage is illustrated as being moved in the Y direction (scan direction) of the coordinates. However, another interferometer and another bar mirror may be provided in relation to the X direction in the coordinates, to perform the reticle stage position measurement in relation to the X and Y axes.

The reticle 8 has a pattern (not shown) formed thereon, and it is transferred, by exposure through a projection optical system 13, onto a wafer 14 having a photosensitive material applied thereto, while being reduced at a predetermined magnification of the projection optical system. Details of this projection optical system will be described later, too.

The wafer 14 is placed on a wafer chuck 16, which is mounted on a wafer stage 15. The wafer stage 15 is made movable by means of a wafer stage driving system (not shown) in X and Y directions along a plane orthogonal to the optical axis. There is a bar mirror 17 fixed to the wafer stage 15. It cooperates with an interferometer 18 for measuring the bar mirror position, to measure the position of the wafer stage 15. In FIG. 1, only one interferometer 18 is illustrated, and the stage is illustrated as being moved in the Y direction (scan direction) of the coordinates. However, since the wafer stage has to move a wafer stepwise in the X direction after completion of the scan exposure, another interferometer and another bar mirror are provided in relation to the X direction in the coordinates, to perform the wafer stage position measurement in relation to the X and Y axes.

The structure of the main assembly will now be described.

A main base table 20 is mounted on plural legs 19. Mounted on the main base table 20 are a stage base table 21 and a barrel base table 22.

The stage base table 21 has a reference surface formed parallel to the X-Y plane. The wafer stage 15 described above is movable in the X and Y directions, along this reference surface. In this embodiment, the wafer stage 15 is supported relative to the stage base table 21, without contact thereto, by means of a guide, which uses a gas bearing. However, the guide for supporting the wafer stage is not limited to a gas bearing. A rolling guide using balls or rollers, or a sliding guide, for example, may be used.

Mounted on the barrel base table 22 are the projection optical system 13 and the interferometer described above, as well as an air-conditioning duct 23 and an outer casing 24. The interferometer 18 is supported by the barrel base 22, which supports the projection optical system 13, and thus, it measures the position of the wafer stage 15 while taking the projection optical system 13 as a reference. The duct 23 functions to blow a gas, from a circulation system to be described later, in a direction perpendicular to the optical axis of the projection optical system 13, through an inside ULPA filter (Ultra-Low Penetration Air-filter) 23'. Thus, the duct 23 serves to stabilize the interferometer light path 18' of the interferometer 18 and the wafer 14 as well as the space substantially encircled by the barrel base 22, at a predetermined temperature. As a result of this, unwanted fluctuation along the interferometer light path 18' as well as unwanted deformation of a member due to a temperature change in the space can be reduced. Also, the duct 23 is effective to reduce the concentration of any light absorptive matters (e.g., oxygen) along the exposure light path, from the bottom end of the projection optical system 13, to the wafer 14.

The reticle stage 9 described above is movable in the Y direction (scan direction) (it may also be moved in the X direction) along a reference surface formed on the outer casing 24. In this embodiment, the reticle stage 15 is supported relative to the outer casing 24, without contact thereto, by means of a guide, which uses a gas bearing. However, the guide for supporting the reticle stage is not limited to a gas bearing. A rolling guide using balls or rollers, or a sliding guide, for example, may be used.

The outer casing 24 surrounds a portion of the projection optical system 13 above the top face of the barrel base 22, and it has an opening 24' formed at its top to allow passage of the exposure light therethrough. Further, the above-described reticle stage 9 and the interferometer 12 as well as an air conditioning duct 25 and the housing 6 are all mounted on this outer casing 24 (the connection between the housing 6 and the outer casing is omitted, by a broken line in the drawing). The interferometer 12 is supported by the outer casing 24, which is formed integrally with the projection optical system 24, and thus, it functions to measure the position of the reticle stage 9 while taking the projection optical system 13 as a reference. The duct 25 functions to blow a gas, from a circulation system to be described later, in a direction perpendicular to the optical axis of the projection optical system 13, through an inside ULPA filter 25'. Thus, the duct 25 serves to stabilize the interferometer light path 12' of the interferometer 12 and the reticle 8 as well as the space around the reticle 8, at a predetermined temperature. As a result of this, unwanted fluctuation along the interferometer light path 12' as well as unwanted deformation of a member due to a temperature change in the space about the reticle can be reduced. Also, the duct 25 is effective to reduce the concentration of any light absorptive matters (e.g., oxygen), along the exposure light path around the reticle 8.

There is a chamber 26 which, in this embodiment, accommodates therein the main assembly of the exposure apparatus, and it has a tightly closed structure for intercepting gas communication with the outside atmosphere. There is a movable member 27, which comprises a bellows made of stainless steel, for example. It functions to connect the chamber 26 with portions adjacent to the legs 19, to thereby secure the tightness of the chamber 26 and also to allow absorption of relative displacement relative to the legs 19 or to the main base table 20.

Also, there is another movable member 28, which comprises a bellows made of stainless steel, for example. It functions to connect the chamber 26 with the chamber 4, to thereby secure the tightness of the chambers 4 and 26 and also to allow absorption of relative displacement between the chamber 26 and the chamber 4, mounted on a supporting table 30.

Further, there is another movable member 29, which comprises a bellows made of stainless steel, for example. It functions to connect the chamber 4 with the housing 6, to thereby secure the tightness of the chamber 4 and the housing 6 and also to allow absorption of relative displacement between the chamber 4 and the housing 6.

In this embodiment, these movable members 27, 28 and 29 are stainless steel bellows. However, provided that the tightness is secured and relative displacement can be absorbed, any other structures may be used. It may be a metal bellows made of nickel alloy or titanium, or it may be a resin bellows. Alternatively, in place of bellows, a magnetic fluid seal may be used.

A load-lock chamber 31 is a chamber to be used when a reticle 8 is loaded or unloaded. It is provided with gate valves 32 and 33, which are opened or closed by a driving system (not shown). A supporting table 34 is a table for supporting the reticle 8. A reticle conveyance robot 35 functions to supply or to collect a reticle to or from the reticle holder 10.

A load-lock chamber 36 is a chamber to be used when a wafer 14 is loaded or unloaded. It is provided with gate valves 37 and 38, which are opened or closed by a driving system (not shown). A supporting table 39 is a table for supporting the wafer 15. A wafer conveyance robot 40 functions to supply or collect a wafer to or from the wafer chuck 16.

Next, the environment control and temperature control inside the chambers 4 and 26 and load-lock chambers 31 and 37 will be described.

A gas supply source 51 serves to supply an inactive gas. In this embodiment, a helium gas or nitrogen gas is supplied thereby. These two kinds of gases have a good transmission factor with respect to $F_2$ laser light.

The gas from the gas supply source 51 is introduced into a gas supply port 53, which is provided in an end portion of the chamber 4, as the light source side. After flowing through the chamber 4, the gas is discharged from a gas discharging port 54, which is provided in another end portion of the chamber 4, at the exposure apparatus side. The gas flows through a pipe 55 and it is discharged by a discharging mechanism 56.

The gas flowpassage inside the chamber 4 will be described with reference to FIG. 2. Components corresponding to those of FIG. 1 are denoted by the same reference numerals, and a description thereof is omitted.

The laser beam emitted from the laser unit 1 is reflected by the mirror 2, and then it is transformed into a predetermined beam shape by means of a beam shaping optical system 201. Thereafter, the laser beam is projected by condenser lenses 204 and 207 to an optical integrator 210 at a predetermined magnification. The optical integrator 210 comprises a plurality of small lenses arrayed two-dimensionally, and, through a condenser lens 213, it functions to superposedly illuminate a conjugate surface 219 of the reticle 8 (FIG. 1). A half mirror 216 is provided between the condenser lens and the above-described conjugate surface to direct light to an illuminance sensor 220. It reflects a portion of the light. The illuminance sensor 220 is disposed on a plane approximately equivalent to the above-described conjugate surface 219. It functions to detect the actual exposure amount upon the wafer 14 (FIG. 1) in the exposure process. On the basis of the detected value of the illuminance sensor 217, a control system (not shown) operates to perform the exposure operation while controlling the state of emission of the laser unit 1.

The beam shaping optical system 201 is supported by a supporting table 202 having a vent 203. The condenser lens 204 is supported by a supporting table 205 having a vent 206. The condenser lens 207 is supported by a supporting table 209 having a vent 208.

The optical integrator 210 is supported by a supporting table 211 having a vent 212. The condenser lens 213 is supported by a supporting table 214 having a vent 215.

The half mirror 216 is supported by a supporting table 217 having a vent 218.

The gas supplied from the gas supply port 53 flows inside the chamber 4 along the light path, and it flows through vents 203, 206, 208, 212, 215 and 218, sequentially, and it is discharged from the gas discharging port 54.

Figure 2:
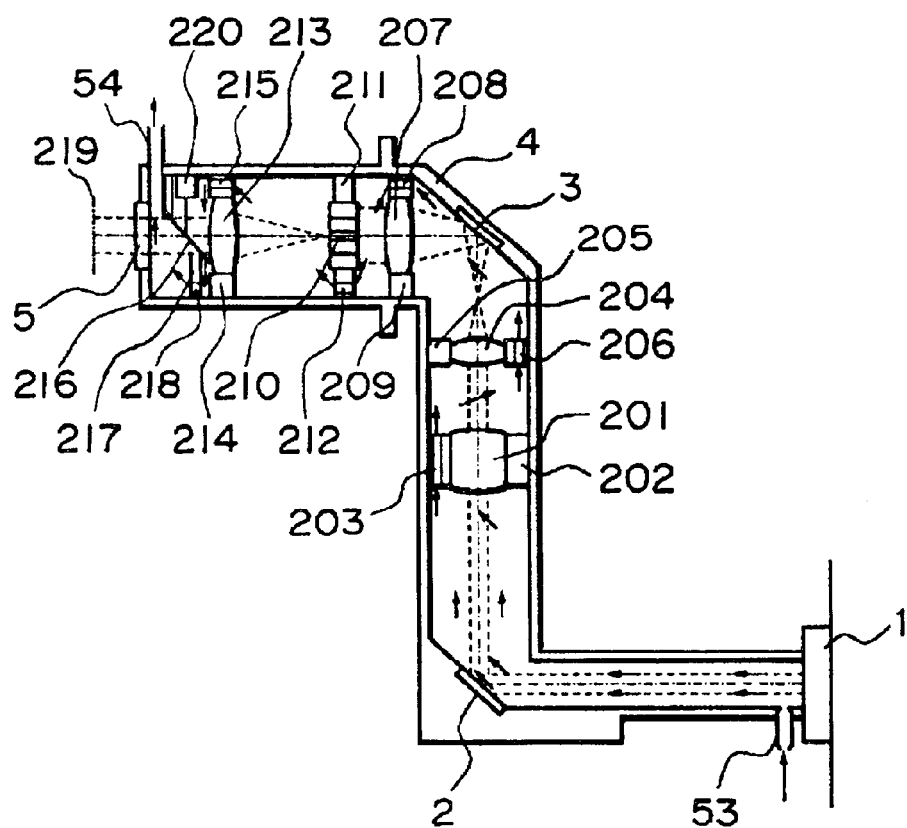
FIG. 2 is a schematic view, showing details of a portion of FIG. 1.

Arrows in FIG. 2 depict the gas flow inside the chamber 4.

Since there is a flowpassage defined to sequentially pass through the spaces among the optical elements inside the chamber 4, as described, gas replacement for the ambience inside these spaces of the optical elements can be accomplished with a good efficiency.

The vents in the chamber 4 should desirably be provided so that the gas flow-passage intersects the optical axis. In FIG. 2, for example, the vents 203 and 206 are provided alternately or diagonally so that a line connecting these vents intersects the optical axis, as viewed in a direction perpendicular to the optical axis. By providing two adjacent vents alternately so that a line connecting them intersects the optical axis, gases about the optical axis can be replaced efficiently, such that the oxygen concentration about the optical axis can be decreased to reduce the light absorption.

Further, as in the chamber 4, efficient gas replacement should desirably be done even at such a position where the optical path is bent or deflected. In consideration of it, in the present invention, as shown in FIG. 2, a vent is provided outwardly of the optical axis being bent, like the vents 206 and 208, for example. In other words, the vents 206 and 208 are disposed so that, when viewed in a direction perpendicular to the optical axis being bent, a line connecting these two vents intersects the optical axis being bent. By providing two vents in this manner, particularly, at the bent portion, the line connecting the two vents intersects, twice, the optical axis being bent. As a result, gas replacement about the light path in the axis-bent portion can be performed very efficiently. When plural vents are used, a line connecting at least one set of vents among them should preferably intersect, twice, the optical axis being bent, as viewed in the direction orthogonal to the optical axis being bent. Further, the intersection with the optical axis being bent may be single.

The disposition of vents at the bent portion of chamber 4 such as described above is not limited to use in an illumination optical system, as long as gas replacement should be done in a portion where the optical axis is bent. For example, if the projection optical system includes a catadioptric system or a catoptric system, for replacement of the ambience at a portion about reflecting members, vents may be disposed similarly, like that in the chamber 4.

Although, in this embodiment, the glass member 5 comprises a parallel flat plate, the invention is not limited to it. Any other transmissive element such as a lens or a prism may be used.

Further, while in this embodiment a fly's eye lens is used as the optical integrator, a rod type integrator may be used in place of it. Alternatively, plural fly's eye lenses may be used and disposed in series. As a further alternative, an optical system comprising a combination of a fly's eye lens and a rod integrator may be used.

The optical system shown in FIG. 2 cooperates with the optical system inside the housing 6 (to be described later), to provide an illumination optical system for illuminating the reticle.

Referring back to FIG. 1, a gas supply source 57 supplies an inactive gas, which is, in this embodiment, helium gas or nitrogen gas. It is not always necessary that the inactive gas supplied from the source 57 be the same as the inactive gas supplied from the gas supply source 51. For example, the supply sources 51 and 57 may supply nitrogen gas and helium gas, respectively. Further, the gases supplied by them may have different oxygen densities.

The gas from the source 57 is directed through a pipe 58 to a gas supply port 59 provided in the housing 6 or bellows 29. After flowing through the housing 6, it is discharged from a gas discharging port 60, formed in an end portion of the housing 6, into the chamber 6.

The gas flowpassage inside the housing 6 will be described with reference to FIG. 3. Components corresponding to those of FIGS. 1 or 2 are denoted by the same reference numerals, and a description thereof is omitted.

A masking blade 301 has an opening of a rectangular shape, for defining an illumination range upon the reticle 8. The size of the rectangular opening can be changed by actuating driving means (not shown) in accordance with the reticle pattern or the position of the reticle 8. A light blocking plate 301' for providing the rectangular opening of the masking blade 301 is disposed close to the conjugate surface 219 of the reticle 8, as described with reference to FIG. 2. Condenser lenses 302 and 305 function to project an image of the rectangular opening, defined by the masking blade 301, onto the reticle 8 at a predetermined magnification. Thus, as described above, the optical system of FIG. 3 cooperates with the optical system of FIG. 2 to provide a portion of an illumination optical system for illuminating the reticle 8.

The light blocking plate 301' is arranged to be moved along a guide (not shown) and, in this embodiment, it uses a gas bearing (non-contact bearing). However, the invention is not limited to this, and a rolling guide using balls or rollers, or a sliding guide, for example, may be used.

The condenser lens 302 is supported by a supporting table 304 having a vent 303. The condenser lens 305 is supported by a supporting table 306.

The gas from the gas supply port 59 flows inside the housing 6 along the light path. After passing through the vent 303 formed in the supporting table 304, it flows along the light path between the condenser lenses 302 and 305. Thereafter, it is discharged from the gas discharging port 60. Arrows in FIG. 3 depict the gas flowpassage inside the housing 6. By providing a flowpassage defined to sequentially pass through the spaces among the optical elements inside the housing 6, as described, gas replacement for the ambience of the optical elements can be accomplished with a good efficiency.

Although, in this embodiment, the gas discharged form the gas discharging port 60 flows directly into the chamber 26, the invention is not limited to this. The gas from the discharging port 60 may be directed to an optical system disposed along the light path, from the housing 6 to the wafer 14, for example, the projection optical system 13, and, after flowing through the projection optical system, the gas may be discharged into the chamber 26.

Figure 3:
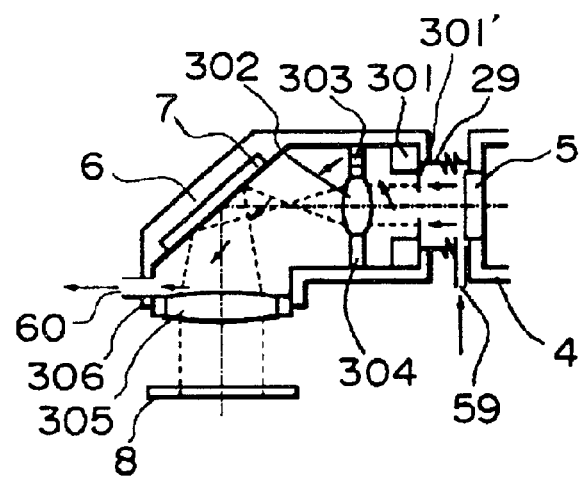
FIG. 3 is a schematic view, showing details of a portion of FIG. 1.

The optical system shown in FIG. 3 is an imaging optical system having a condenser lens system. However, in place of it, a catadioptric system or catoptric system may be used.

Further, as regards the shape of the opening of the masking blade 301, while it is explained as a rectangular shape in this embodiment, an arcuate-shaped opening having a predetermined curvature may be used.

In FIG. 1, the gas from the gas supply source 57 is directed through a pipe 61 to a gas supply port 62 provided in an end portion of the projection optical system 13, at the wafer side. After flowing through the projection optical system 13, it is discharged from a gas discharging port 63 provided in another end portion of the projection optical system 13, at the reticle side, into the chamber 26.

Figure 4:
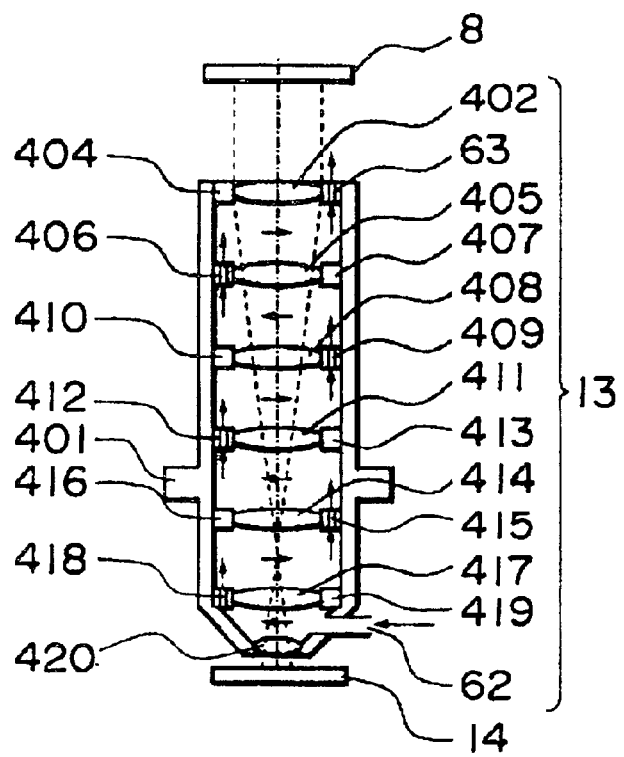
FIG. 4 is a schematic view, showing details of a portion of FIG. 1.

The gas flowpassage inside the projection optical system 13 will be explained with reference to FIG. 4. Components corresponding to those of FIGS. 1 or 3 are denoted by the same reference numbers, and a description thereof is omitted.

The pattern formed on the reticle 8 is projected onto the wafer in a reduced scale, by means of lenses 402, 405, 408, 411, 414, 417 and 420. Denoted at 401 is a barrel for these lens groups.

The lens 402 is supported by a supporting table 404 having a gas discharging port 63. The lens 405 is supported by a supporting table 407 having a vent 406. The lens 408 is supported by a supporting table 410 having a vent 409. The lens 411 is supported by a supporting table 413 having a vent 412. The lens 414 is supported by a supporting table 416 having a vent 415. The lens 417 is supported by a supporting table 419 having a vent 418. The lens 420, as well as the above-described supporting tables 407, 410, 413, 416 and 419, are supported by a barrel 401.

The gas from the gas supply port 62 flows through the vents 418, 415, 412, 409 and 406, formed in the supporting tables, sequentially, and it is discharged from the gas discharging port 63. Arrows in FIG. 4 depict the gas flowpassage inside the projection optical system 13. Since there is a flowpassage defined to sequentially pass through the spaces among the optical elements inside the projection optical system 13, as described, gas replacement for the ambience inside these spaces of the optical element can be accomplished with a good efficiency.

Although in this embodiment the gas discharged from the gas discharging port 63 flows directly into the chamber 26, the invention is not limited to this. The gas from the discharging port 402 may be directed to an optical system disposed along the light path, from the glass member 5 (FIGS. 1–3) to the wafer 14, for example, the housing 6 (FIGS. 1 and 3), and, after flowing through the housing 6, the gas may be discharged into the chamber 26.

In this embodiment, the projection optical system 13 comprises a dioptric system. However, in place of it, a catadioptric system or catoptric system may be used.

The gases discharged from the gas discharging ports 60 and 63 into the chamber 26 are discharged from a circulation outlet port 70 of the chamber 26. The gas is directed through a pipe 71 to an inlet port 73 of a gas circulation system 72. The gas is distributed inside the circulation system 72 into predetermined flow rates, and they are discharged from distribution outlet ports 74a, 74b, 74c and 74d of the circulation system 72, respectively.

The gas discharged from the distribution outlet port 74a is directed through a pipe 75a to a down-flow duct 76, which is effective to transform approximately the entirety of the gas inside the chamber 26 into a down flow. After flowing through a ULPA filter 76' inside the down-flow duct 76, the gas is blown into the chamber 26.

The gas discharged from the distribution outlet port 74b is directed through a pipe 75b to a partial duct 25 and, as described hereinbefore, it is blown into the space adjacent to the reticle 8 and the interferometer light path 12'.

The gas discharged from the distribution outlet port 74c is directed through a pipe 75c to a gas inlet port 41 of the outer casing 24. After flowing through the space between the projection optical system 13 and the outer casing 24, the gas is discharged from the opening 24' of the outer casing 24 into the chamber 26.

The gas discharged from the distribution outlet port 74b is directed through a pipe 75d to a partial duct 23 and, as described hereinbefore, it is blown into the space adjacent to the wafer 14 and the interferometer light path 18'.

Next, the inside structure of the gas circulation system 72 will be described.

The gas from the inlet port 73 is blown by a fan 102 for gas circulation. A direction changing valve 103 functions to blow a gas into a selected one of first and second purifiers 104 and 105 and also to intercept the gas flow into the other. Also, another direction changing valve 106 functions to open the flow passage of one of the first and second purifiers 104 and 105, being gas supplied, and to block the flow passage of the other. Thus, both the changing valves 103 and 106 are operated at once by a valve driving system (not shown) to open the flow passage of the same purifier and to shut the other purifier.

There is a gas supply source 107 for supplying an inactive gas, which is helium gas or nitrogen gas, in this embodiment.

The gas from the supply source 107 is supplied to the first and second purifiers 104 and 105, respectively, through pipes 108 and 109. A switching valve 110 functions to perform ON/OFF control of the gas supply to the first purifier 104, by using a driving system (not shown). Another switching valve 111 functions to perform ON/OFF control of the gas supply to the second purifier 105, by using a driving system (not shown). A gas discharging mechanism 112 serves to discharge the gas from the first purifier by using a pipe 113 and to discharge the gas from the second purifier by using a pipe 114. The gas flow from the first purifier to the gas discharging mechanism 112 is ON/OFF controlled by a switching valve 115, while the gas flow from the second purifier to the gas discharging mechanism 112 is ON/OFF controlled by another switching valve 116.

Figure 5:
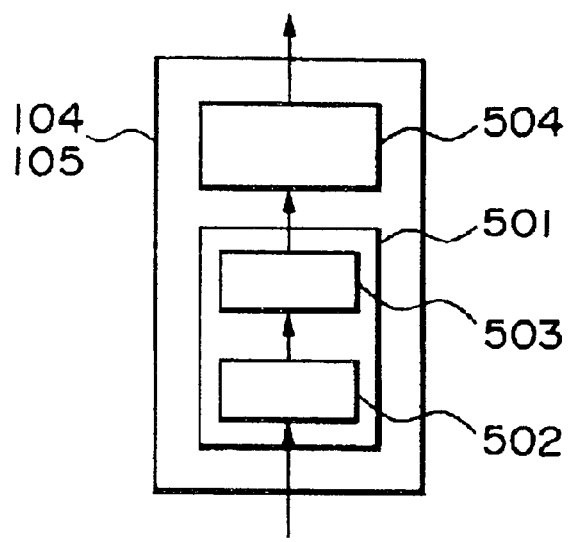
FIG. 5 is a schematic view, showing details of a portion of FIG. 1.

Details of the first and second purifiers 104 and 105 will be described, with reference to FIG. 5. Components corresponding to those shown in FIG. 1 are denoted by the same reference numerals, and a description thereof is omitted.

Each of the purifiers 104 and 105 is provided with an ozone and oxygen removing mechanism 501 and a chemical filter 504, for removing predetermined substances in the purging gas. The ozone and oxygen removing mechanism 501 includes, as an internal structure thereof, an ozone converting mechanism 502 and an oxygen removing mechanism 503, for removing ozone and oxygen in the gas from the inlet port. The ozone converting mechanism 502 functions to convert ozone ($O_3$) into oxygen ($O_2$), and it serves to remove ozone by converting ozone into oxygen in accordance with a conversion principle based on chemical reaction, using activated charcoal, for example.

The thus converted oxygen and the oxygen passed through the ozone converting means 502 are removed by the subsequent oxygen removing mechanism 503. The oxygen removing mechanism 503 uses iron powder, CaO and Cu mesh, and the like, to cause a chemical reaction (oxidation) by contact with oxygen in the gas, such that the oxygen is removed by attraction. Alternatively, a commercially available high-purity gas purifier may be used.

Since the inside of the chamber 26 has been replaced by an inactive gas such as helium gas or nitrogen gas, the oxygen concentration and ozone concentration are very low. However, even a very small amount of remaining ozone and oxygen (e.g., ppm order or lower) can be removed by the ozone and oxygen removing mechanism 501 described above. Here, the oxygen concentration in the chamber 26 may be set slightly high as compared with the ambience inside a closed space surrounding the light path of the projection optical system 13, the housing 6 and the chamber 4, for example. Since the gas purity inside the chamber 26 may be set to be lower than the gas purity of the ambience surrounding the light path, the inside ambience control of the chamber 26 is made easier.

The chemical filter 504 removes impurities in the purging gas, more specifically, ammonia ($NH_3$), or an organic gas. Examples of ordinary chemical filters are an ion exchange type and an activated charcoal type. In this embodiment, a ceramics porous type is used. A ceramics porous type chemical filter maintains a high impurity removing capacity even in an environment of very low humidity (e.g., ppm order or lower) and, thus, from the standpoint of purification efficiency, the ceramics porous type is preferable.

However, if such a ceramics porous type chemical filter is once exposed to a highhumidity environment such as the atmosphere, it absorbs water ($H_2O$). If it is used in operation in such a state, there is a possibility that a gas with a water content is supplied to the chamber 26.

This problem can be solved as follows.

Figure 6A:
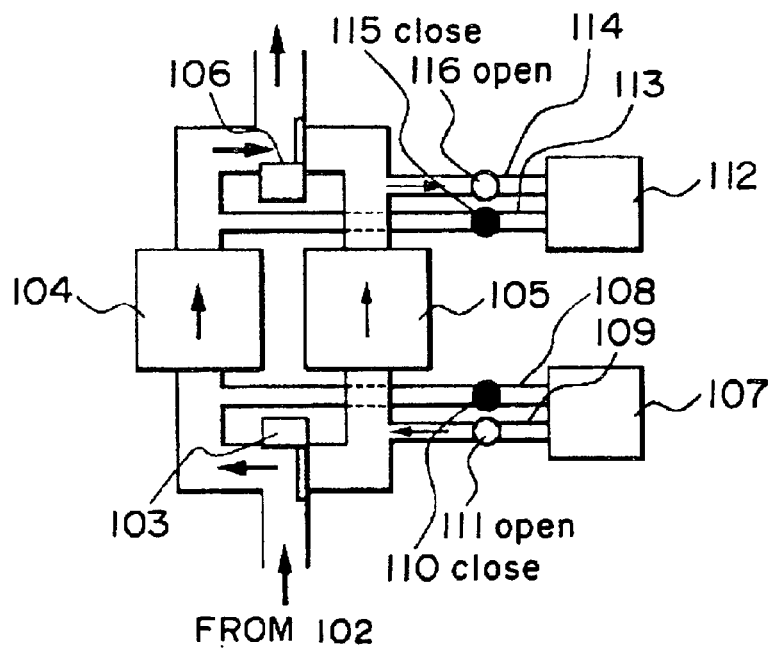
FIGS. 6A and 6B are schematic views, respectively, each showing details of a portion of FIG. 1.
Figure 6B:
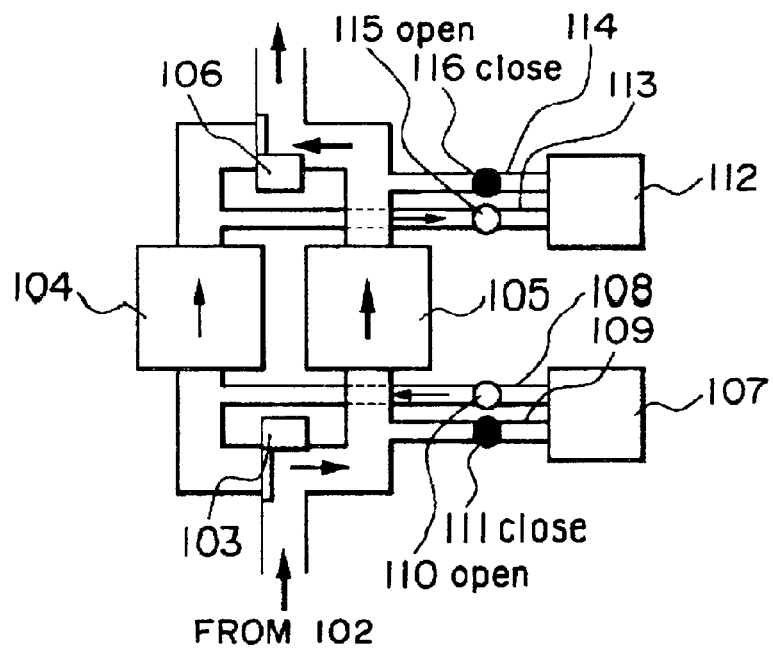

Referring to FIGS. 6A and 6B, the relation between the gas flow and set states of the direction changing valves 103 and 106 and the switching valves 108, 109, 115 and 116, will be explained.

FIG. 6A shows a state in which the gas from the fan 102 flows through the first purifier 104 side. Components corresponding to those of FIG. 1 are denoted by the same reference numerals. In the state of FIG. 6A, both the direction changing valves 103 and 106 shut the second purifier 105 side, and the switching valves 110 and 115 are closed. Thick arrows illustrate the gas flow to the first purifier 104 side, in this case.

As regards the second purifier 105, on the other hand, when the switching valves 111 and 116 are closed, both the upstream and downstream of the second purifier 105 are shut (not shown). Therefore, replacement of the second purifier 105 or maintenance of it can be done. If, as shown in the drawing, the switching valves 111 and 116 are opened, the supply of gas from the gas supply source 107 is initiated and, also, the gas flowing through the second purifier 105 is collected by the gas discharging means 112. Thin arrows depict the gas flow in this case.

As described above, the gas from the supply source 107 flows to the second purifier 105. As a result, even if the second purifier 105 is exposed to the atmosphere during replacement of the same or the maintenance thereof so that a substance such as oxygen or water which absorbs the exposure light is attracted to it, the gas supply can effectively reduce the substance attracted to the second purifier. Further, at the first purifier 104 side, the gas can flow there even during the replacement of the second purifier 105 or the maintenance thereof. Therefore, the replacement or maintenance can be done without stopping the operation of the apparatus.

During normal operation, the ceramics porous type chemical filter 504 functions as a water content removing filter. Therefore, after the apparatus is operated for a predetermined period of time, the purifier may be interchanged, such that the purification capacity of the purifier not used (second purifier 112 side in the drawing) may be recovered. The recovery level of the purification capacity may be discriminated on the basis of the gas flow time of the gas supply source 107 or, alternatively, a gas detector (not shown) may be disposed just after the purifier to check the level on the basis of the result of the detection.

FIG. 6B shows a state in which, to the contrary to FIG. 6A, the gas from the fan 102 flows through the second purifier 105 side. The flow of gas from the fan 1002 and the flow of gas from the gas supply source 107 as well as the replacement of the first purifier, for example, are all inverse to what has been described above and, therefore, a description thereof is omitted.

Although this embodiment has been described with reference to a case wherein two purifiers are used, the invention is not limited to this. Three or more purifiers may be used.

Further, while the gas from the gas supply source 107 should desirably be the same as the gas from the gas supply source 57 shown in FIG. 1, a different gas of either helium gas or nitrogen gas may be used, as long as it does not adversely affect the performance. In a case in which the gas supply sources 57 and 107 use the same gas, a common gas supply source may be provided and used for these sources.

Referring back again to FIG. 1, the gas from the direction changing valve 106 is cooled by a cooling device 101 to a predetermined temperature and, after it, the gas is distributed to heaters 117a–117d at a predetermined flow rate proportion.

The heater 117a is controlled at a predetermined temperature in accordance with the detection by a thermometer 77a for detecting the gas temperature from a down-flow duct 76, and in response to a signal from a control unit 78.

The heater 117b is controlled at a predetermined temperature in accordance with the detection by a thermometer 77b for detecting the gas temperature from the partial duct 25, and in response to a signal from the control unit 78.

The heater 117c is controlled at a predetermined temperature in accordance with the detection by a thermometer 77c for detecting the gas temperature inside the outer casing 24, and in response to a signal from the control unit 78.

The heater 117d is controlled at a predetermined temperature in accordance with the detection by a thermometer 77d for detecting the gas temperature from the partial duct 23, and in response to a signal from the control unit 78.

The gas from the gas supply source 57 described above may be controlled at a predetermined temperature inside the gas supply source 57 or, alternatively, the piping path may be determined so that the pipe 58 or 61 extends through a space being temperature controlled as described and the gas reaches the predetermined temperature until it arrives in the gas supply port 59 or 62.

In FIG. 1, a high-pressure gas supplying unit 79 collects, in a pipe 80, a portion of the gas inside the chamber 26. After the pressure is raised to a predetermined gas pressure, it supplies the gas to a gas bearing (not shown) of the wafer stage 15 through a pipe 81, to a gas bearing (not shown) of the reticle stage 9 through a pipe 81 b, and to a gas bearing (not shown) of the masking blade 301 (FIG. 3) through a pipe 81c, respectively. By using the inactive gas (purge gas) inside the chamber 26 as a working fluid of the gas bearings, the inside environment of the chamber 26 can be maintained in a predetermined state.

Figure 7:
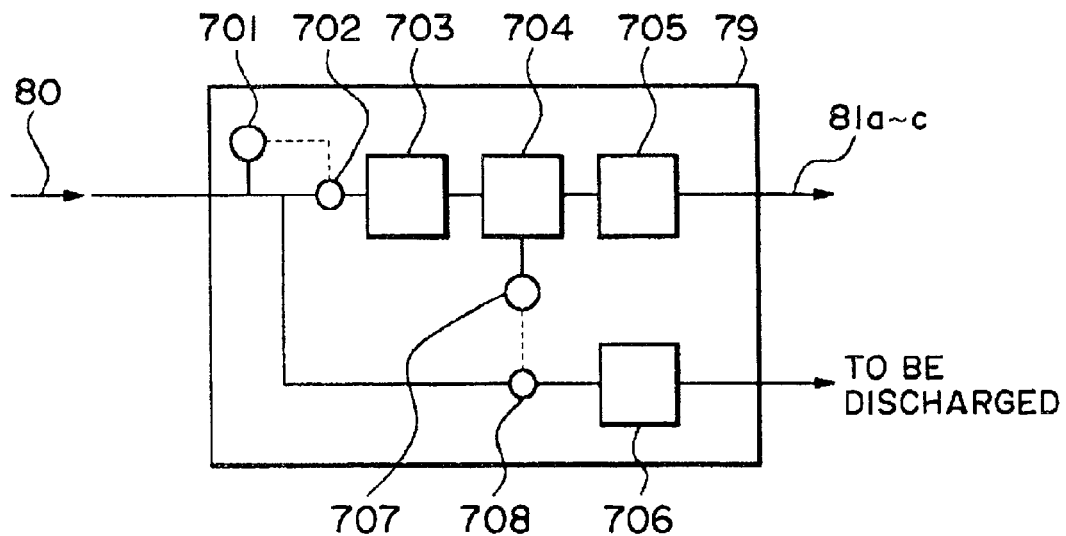
FIG. 7 is a schematic view, showing details of a portion of FIG. 1.

Referring to FIG. 7, the inside structure of the high-pressure gas supplying unit 79 will be explained.

The gas pressure from the pipe 80 is detected by a pressure gauge 701, and a control valve 702 is controlled by the control unit 78 (FIG. 1), whereby a predetermined flow rate is controlled. The gas being controlled by the control valve to a predetermined flow rate flows through a collecting pump 703, and it is reserved into a buffer reservoir 704. Then, the gas is pressurized by a compressor 705 to a predetermined pressure, and caused to flow into the pipes 81a–81c. Also, the gas flowpassage is branched between the pressure gauge 701 and the control valve 702, and the gas is discharged by a discharging pump 706. The discharging amount is controlled, as required, by a mass flow controller 708 in accordance with the detection by a pressure gauge 707, provided at the buffer reservoir 704. The mass flow controller 708 is controlled by the control unit 78 (FIG. 1) on the basis of the detection by the pressure gauge 707.

With the structure described above, the pressure inside the chamber 26 can be controlled continuously to be a constant pressure. As a result, the optical characteristic, which may otherwise be easily influenced by a pressure change, for example, the performance of the projection optical system 13 (FIG. 1), can be maintained.

Further, the relative pressure difference between the inside pressure of the chamber 26 and the outside atmosphere can be kept at a predetermined level. This can be accomplished by using the pressure gauge 701 as a differential pressure gauge and by detecting the pressure difference between the inside pressure of the pipe 80 (i.e., chamber 26) and the outside atmosphere.

Further, the relative inside pressure difference between the chambers 26 and 4 can be kept at a predetermined level. This can be accomplished by using the above-described differential pressure gauge and by detecting the relative inside pressure difference between the pipe 80 (i.e., chamber 26) and the chamber 4.

In FIG. 1, the gas from the gas supply source 57 is supplied to a wafer load-lock chamber 36 through a pipe 82. The gas is then discharged to a gas discharging mechanism 86 through a pipe 83, while replacing the inside space. Similarly, the gas from the gas supply source 57 is supplied to a reticle load-lock chamber 31 through a pipe 84, and it is discharged to a gas discharging mechanism 86 through a pipe 85, while replacing the inside space.

As regards the gas supply timing, after the gate valve 32 or 37 is opened and a reticle or a wafer is placed on the support table 34 or 39, the gate valve 32 or 37 is closed. Thereafter, a valve (not shown) provided in the gas discharging mechanism 86 is opened, in response to signals from the control unit 78.

As the load-lock chambers 31 and 36 reach a predetermined state, the valve is closed in response to a signal from the control unit 78, whereby the gas supply is stopped. Further, the gate valves 33 and 38 are opened, and a reticle 8 and a wafer 14 are introduced into the apparatus by conveyance means 35 and 40.

When the reticle 8 or the wafer 14 is to be unloaded outwardly, the gas supply is initiated in a state in which the gate valves 32, 33, 37 and 38 are closed. As the load-lock chambers reach a predetermined state, the gas supply is stopped. Subsequently, the gate valves 33 and 38 are opened, and the reticle 8 and the wafer 14 are unloaded from the apparatus by the conveying means 35 and 40, and then they are placed on the support tables 34 and 39 in the load-lock chambers 31 and 39, respectively. After this, the gate valves 33 and 38 are closed. Then, the gate valves 32 and 37 are opened, and the reticle 8 and the wafer 14 are taken out by using separate means (not shown).

The foregoing description has been made of an example wherein loading and unloading of the reticle 8 and the wafer 14 to and from the apparatus are carried out simultaneously. However, as a matter of course, they may be done separately.

The gas replacement of the load-lock chambers 31 and 36 is made to avoid any influence to the inside environment of the chamber 26 to be caused when the gate valves 33 and 38 are opened. This is well known in the art.

When a pellicle (not shown) is used for prevention of dust adhesion to the pattern surface of the reticle 8, the space enclosed by the reticle 8, the pellicle and a pellicle frame (not shown) for supporting the pellicle, should desirably be gas purged. In this connection, use of a pellicle frame with even pressure bores (a frame formed with bores for communicating inside and outside the frame) is preferable.

A discharging port 87 is a port for discharging the gas inside the chamber 26 outwardly.

As the operation of the apparatus starts, the inside of the chamber 26 and the inside of the gas circulation system 72 are kept in an atmospheric state. Thus, at the start of the operation, the gas supply from the gas supply source 57 to the projection optical system 13 and to the housing 6 is initiated. Also, gas discharging from the discharging port 87 to the gas discharging mechanism 86 through the pipe 88 is carried out. The ON/OFF control for this gas discharging operation is made by controlling a valve (not shown) provided in the gas discharging means 86 by use of the control unit 78.

As the chamber 26 and the circulation system reach a predetermined replacement state, the gas discharging from the discharging port 87 is stopped, whereby an exposure operation enabled state is accomplished.

As regards discrimination of the timing for stopping the gas discharging from the discharging port 87, it may be concluded by the control unit 78 automatically on the basis of whether a predetermined time is elapsed from the start of gas discharging or not. Alternatively, a gas detector (not shown) may be provided at a predetermined position inside the chamber 26 or inside the circulation system, so that the control unit 78 automatically discriminates it on the basis of the detection result, to transmit a signal for stopping the gas discharging.

Also, when the operation of the apparatus is to be started, if a predetermined replacement state should be established inside the chambers 4 and 26 in a short time or, alternatively, because in the load-lock chambers 31 and 36 the opening to the atmosphere and the gas replacement are repeated each time the reticle or the wafer is exchanged, the replacement should be completed in a short time for an improved throughput. Therefore, a vacuum pump may be used to forcibly evacuate the atmosphere from the gas discharging means 56 and 86 to produce a vacuum in the inside spaces of the chambers 4 and 26 and of the load-lock chambers 31 and 36. After this, the gas purging may be carried out. In this case, the chambers 4 and 26 and the load-lock chambers 31 and 36 should have a sufficient rigidity so as to avoid that any deformation in the vacuum state adversely affects the performance of the apparatus.

In the embodiment of FIG. 1, since there are movable members 27, 28 and 29 used, even if any deformation is produced in the chamber 4 or 26 in the vacuum state, direct transmission of deformation of an adjacent structural component is effectively prevented.

Sequential operations for providing a vacuum inside the chambers and load-lock chambers and subsequently for supplying a gas thereinto, may be repeated plural times, as necessary. On that occasion, as compared with a single vacuum-setting operation, the vacuum level reached in the chamber or load-lock chamber may be a relatively low vacuum (higher absolute pressure), such that the cost for the vacuum pump or components can be reduced largely.

In accordance with the embodiment of FIG. 1, when the chamber 4 should be opened to the atmosphere for maintenance or the like, the purged state of the chamber 26 side can be maintained. On the other hand, when the chamber 26 is opened to the atmosphere, the purged state of the chamber 4 side can be retained.

When a vacuum is to be produced in the reticle load-lock chamber 31, a pellicle frame with even pressure bores (not shown) as described above may be used, and unwanted damage of or breakage to the pellicle or reticle can be prevented.

Embodiment 2

Figure 8:
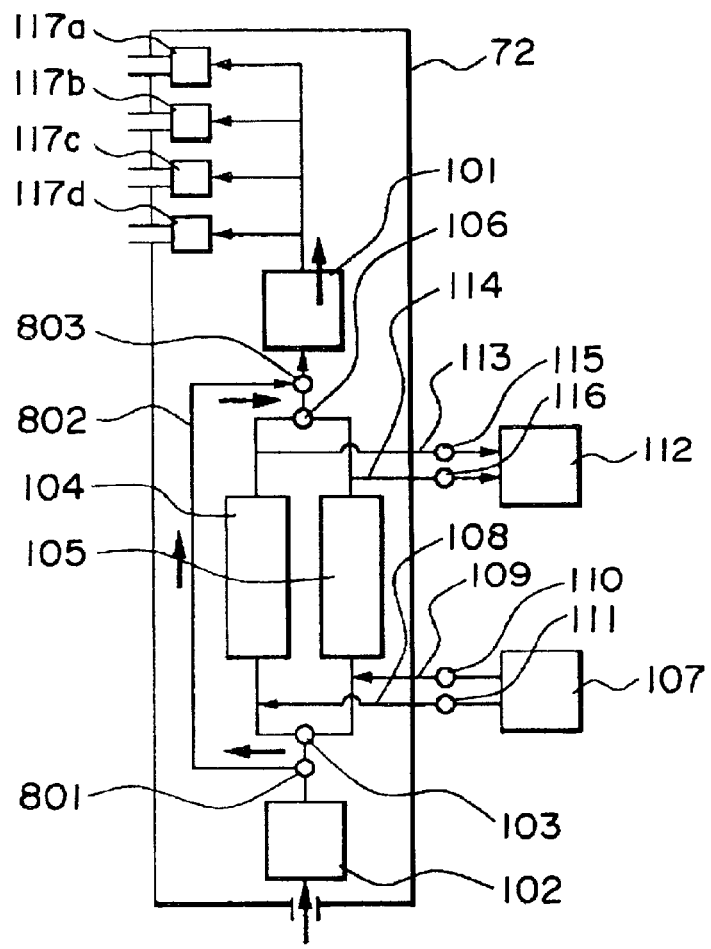
FIG. 8 is a schematic view of a main portion of an exposure apparatus according to a second embodiment of the present invention.

Referring to FIG. 8, a second embodiment of the present invention directed to a modified example of the gas circulation system 72 of FIG. 1 will be described.

This embodiment differs from the preceding embodiment in that direction changing valves 801 and 703 and a bypass way 802 are added to the gas circulation system 72. Components corresponding to those of FIG. 1 or FIG. 6 are denoted by the same reference numerals, and a description thereof is omitted.

The direction changing valve 801 functions to blow the circulation gas, supplied from the fan 102, toward one of the purifiers 104 and 105 and the bypass way 802 and also to intercept the gas flow to the other. Also, the direction changing valve 803 functions to open the flowpassage to one of the purifiers 104 and 105 and the bypass way 802 and to shut the other flowpassage. Thus, both the direction changing valves 801 and 803 are operated at once by a valve driving system (not shown) so as to open the same flowpassage and to shut the other flowpassage.

The bypass way 702 is a flowpassage, which is provided in parallel to the flowpassages to the purifiers, so as to direct the gas, introduced by the valve 801, to the cooling device 101 without passing through the purifiers 104 and 105.

When the apparatus starts, as described hereinbefore, the circulation system is filled with an atmosphere. Thus, initially, as depicted by thick arrows, the circulation gas is supplied to flow via the bypass way 802. Then, after the environment of the circulation system reaches a predetermined state, the direction changing valves 801 and 803 are changed by driving means (not shown) so that the gas passes one of the first and second purifiers 104 and 105. This is preferable particularly from the standpoint of the lifetime of the purifier.

As regards discrimination of whether the circulation system environment has reached the predetermined state, it may be done by controlling the time period in which the gas passes through the bypass way 802 by use of a control system (not shown). Alternatively, a gas detector (not shown) may be provided at a predetermined position inside the circulation system so that the discrimination may be made on the basis of the detection. The direction changing valves 801 and 803 may be changed automatically in accordance with the discrimination on the circulation system environment state, or alternatively, they may be changed by using a control system (not shown).

Embodiment 3

Figure 9:
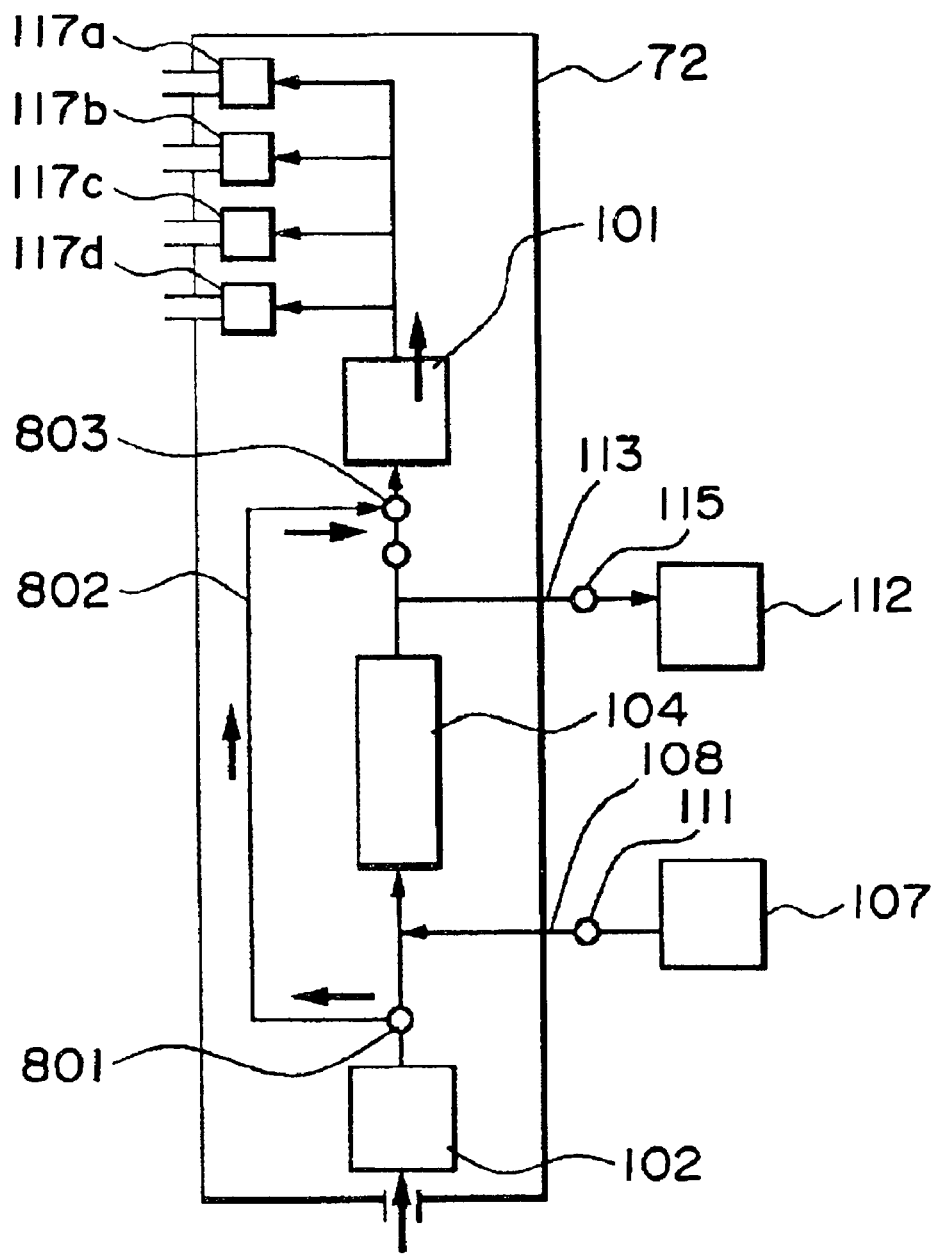
FIG. 9 is a schematic view of a main portion of an exposure apparatus according to a third embodiment of the present invention.

Referring to FIG. 9, a third embodiment of the present invention directed to a modified example of the gas circulation system of FIG. 8 will be described.

This embodiment differs from the preceding embodiment in that only one purifier is used. Use of the bypass way 802 has a similar advantage also in a case where only one purifier is used.

As long as a decrease in the purity of the circulation gas within the chamber is in an acceptable range, the replacement of the purifier 104 or the maintenance thereof may be done in the period in which the gas flows through the bypass way.

Embodiment 4

Figure 10:
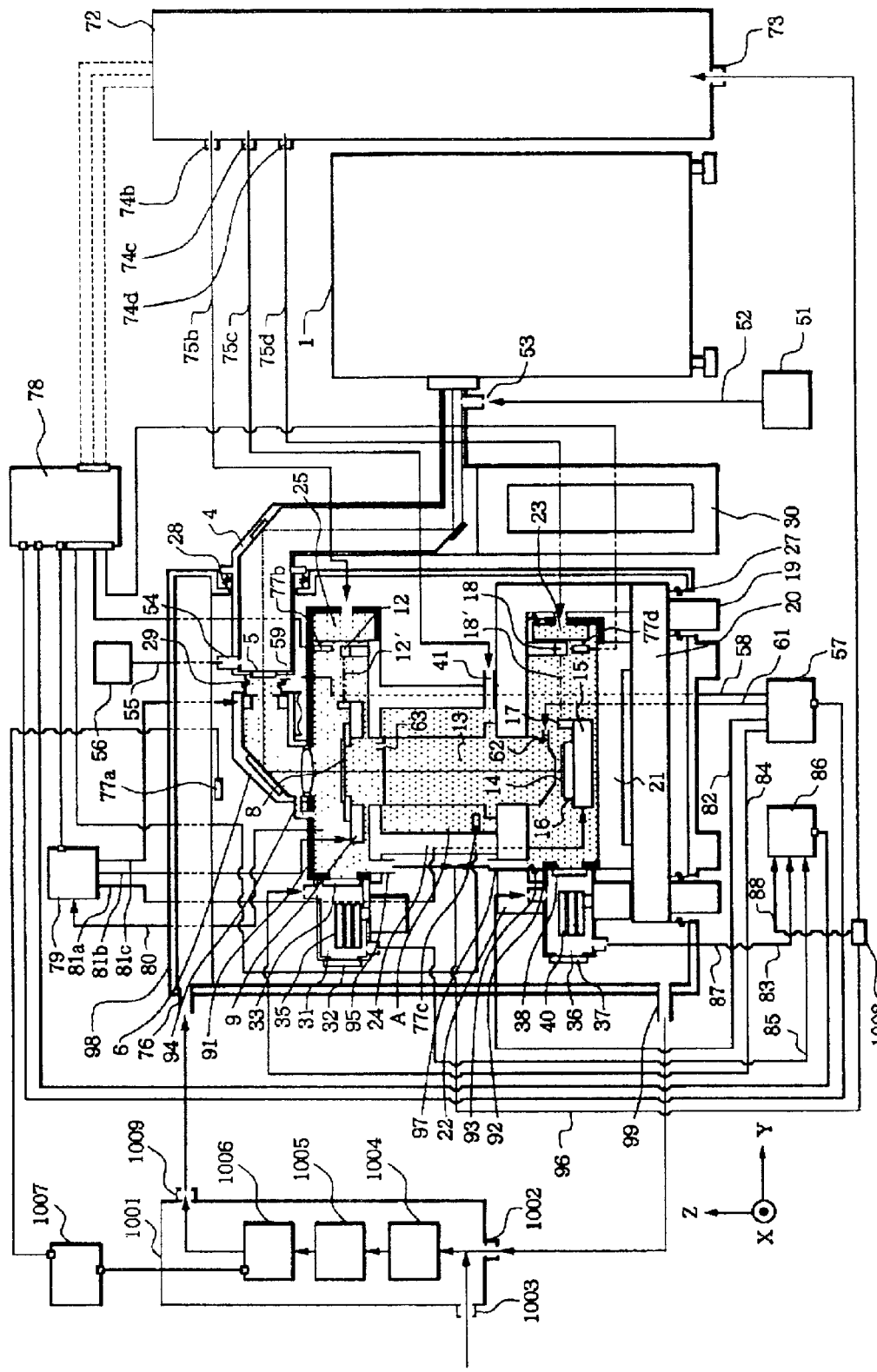
FIG. 10 is a schematic view of a main portion of an exposure apparatus according to a fourth embodiment of the present invention.

FIG. 10 shows a fourth embodiment, which concerns a modified example of the chamber 26 of FIG. 1.

A reticle chamber 91 is a tightly closed container, which accommodates therein a partial duct 25, an interferometer 12 and a reticle stage 9, for example. In this embodiment, the chamber 91 is mounted on the outer casing 24.

A wafer chamber 92 is a tightly closed container, which accommodates therein a partial duct 23, an interferometer 18 and a wafer stage 15, for example. In this embodiment, the chamber 92 is mounted on the stage base table 21. Further, the wafer chamber 92 is connected to the barrel base 22 through a movable member 93 effective to secure the tightness and to absorb relative displacement. The movable member 93 is a bellows made of stainless steel. However, it may be a metal bellows made of nickel alloy or titanium, or it may be a resin bellows, provided that the tightness is secured and relative displacement can be absorbed thereby. Alternatively, in place of a bellows, a magnetic fluid seal may be used.

In FIG. 10, the housing 6, the reticle chamber 91, the outer casing 24, the barrel base 22, the wafer chamber 92 and the stage base table 21 are connected to each other, while securing the closed tightness. Further, they are unified to provide a chamber which defines a closed space as depicted by a dot pattern A in the drawing.

A gas discharging port 94 of the housing 6 is connected to the reticle chamber 91, such that a gas flowpassage is defined from the housing 6 to the reticle chamber 91. The gas inside the reticle chamber 91 is directed from a discharging port 95 through a pipe 96 to the gas inlet 73 of the gas circulation system 72. On the other hand, the gas inside the wafer chamber 92 is discharged from a gas discharging port 97. The flow is combined with the above-described pipe 96, and then to the gas circulation system 72.

As regards the gas flows in the housing 6, the projection optical system 13 and the outer casing 24, as well as in the partial ducts 25 and 23, they are similar to what has been described with reference to FIGS. 1, 2, 3 and 4. Therefore, further description is omitted.

In the embodiment of FIG. 1, the chamber 26 provides a closed container, and the inside thereof is replaced by a gas. In this embodiment, on the other hand, as described above, the closed container covers only the space along the exposure light path. Therefore, some structures of the apparatus, such as the barrel base 22 and the outer casing 24, for example, are partially placed outside the purge area. If such structures are directly exposed to the atmosphere, they may be influenced by the temperature change in the atmosphere and a desired apparatus performance may become difficult to accomplish inside the purge area. In consideration of this, use of a temperature controlled chamber 92 is preferable.

The temperature controlled chamber accommodates therein a down-flow duct 76 similar to that of the FIG. 1 embodiment. The gas blown downwardly from the down-flow duct 76, which is temperature controlled air, in this example, is discharged from a circulation outlet port 99 and is directed to an inlet port 1002 of an air circulation system 1001. There, the gas is mixed with an outside atmosphere supplied from an atmosphere inlet port 1003 and, then, it is blown by a fan 1004. Subsequently, the air is once cooled to a predetermined temperature by means of a cooling device 1005 and, thereafter, it is heated by a heater 1006 to a predetermined temperature. After this, the temperature controlled air flows from an outlet port 1009 again into a down-flow duct 76. The circulation path inside the temperature controlled chamber 98 is such as described above. The temperature of the air from the downflow duct 76 is measured by a thermometer 77a provided inside the chamber 98, and a control system 1007 controls the heater 1006 on the basis of the temperature detection, whereby a predetermined temperature can be maintained.

In this embodiment, the reticle conveying load-lock chamber 31 is mounted on the reticle chamber 91. On the other hand, the wafer conveying load-lock chamber 36 is mounted on the wafer chamber 92. Conveyance robots 35 and 40 for them are disposed in the loadlock chambers 31 and 36, respectively.

A pipe 80, which is communicated with a high-pressure gas supply unit 79, functions, in this embodiment, to direct the gas inside the reticle chamber 91. However, the invention is not limited to this. It may be used for a gas anywhere inside the purge area as depicted by the dot pattern A in the drawing, such as the inside space of the housing 6, the outer casing 24 or the wafer chamber 92, for example.

As regards the gas replacement of the dot pattern area A (the region encircled by housing 6, reticle chamber 91, outer casing 24, barrel base 22, wafer chamber 92 and stage base table 21), when the apparatus starts, a branch valve 1008 disposed in the course of the pipe 96 may be switched by control means (not shown) so that, while causing the gas discharging mechanism 86 to perform the gas discharging, the gas is supplied from the gas supply source 57 and through pipes 58 and 61. As a predetermined state is established in the dot pattern area A, the branch valve 1008 is switched so that the gas is circulated to the gas circulation system 72 side. Alternatively, while keeping the gas supply from the gas supply source 57 stopped, a vacuum pump (not shown) inside the gas discharging mechanism 86 may be used to forcibly evacuate the gas and, after that, the branch valve may be switched to provide a gas flow to the gas circulation system 76 so that the gas from the supply source 57 is supplied through the pipes 58 and 61. The vacuum evacuation and gas supply described above may be made only once or, alternatively, they may be repeated plural times. The timing for switching the branch valve 1008 and gas supply from the gas supply source 57 may be controlled automatically on the basis of the detection made through gas detectors (not shown) disposed in the circulation system and the dot pattern area A. Alternatively, it may be controlled on the basis of the evacuation time.

Although in this embodiment the branch valve 1008 is disposed along the pipe 96, it may be disposed at any other place in the circulation path as defined by the gas circulation system 72 and the dot pattern area A.

As regards the connection among the housing 6, the reticle chamber 91, the outer casing 24, the barrel base 22, the wafer chamber 92 and the stage base table 21, a movable member such as the member 93 may be used to substantially intercept any deformation of each container or case as it is placed in the vacuum state, to prevent an adverse influence to adjacent structures. Further, in this embodiment, while the wafer chamber is coupled to the stage base table 21, the chamber 92 may be connected to the main base table 20 so as to accommodate therein the stage base table 21.

Further, in this embodiment, the gas outside the dot pattern area A and inside the chamber 98 is temperature controlled air. However, the invention is not limited to this. An inactive gas may be used. On that occasion, the purity of the inactive gas used in the chamber 98 may be lower than that of the inactive gas in the dot pattern area A. The inactive gas used in the dot pattern area A may be introduced into the chamber 98 for reuse of it. Further, when a helium gas is used as a purge gas of the dot pattern area A, and if helium is used also for the purge gas of the chamber 98, a large quantity of helium gas is required. In consideration of this, nitrogen may be used on that occasion as a purge gas for the chamber.

Embodiment 5

Figure 11:
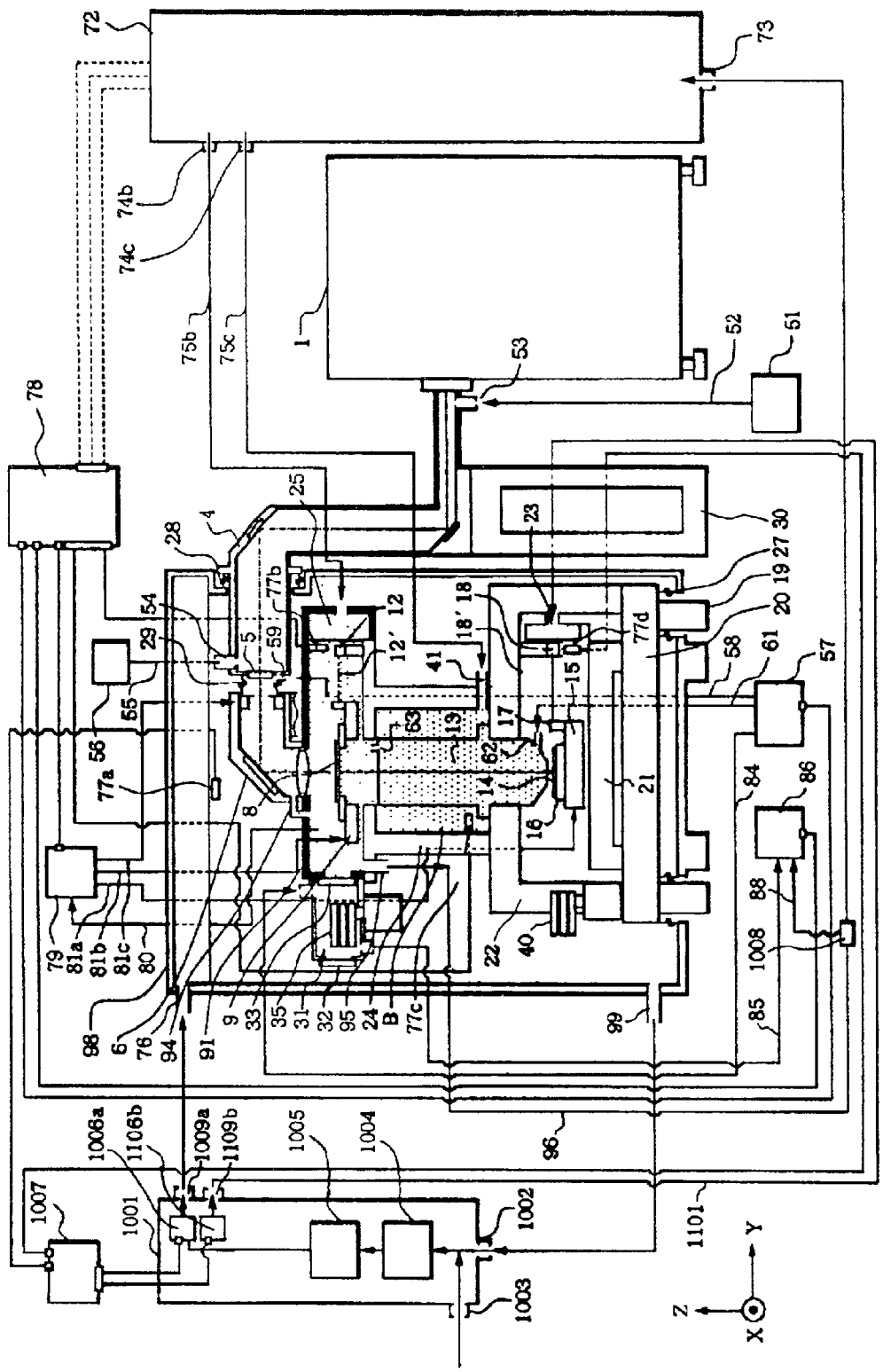
FIG. 11 is a schematic view of a main portion of an exposure apparatus according to a fifth embodiment of the present invention.

FIG. 11 shows a fifth embodiment concerning a modified example of the chamber 26 of FIG. 1. Components corresponding to those of FIGS. 1 and 10 are denoted by the same reference numerals, and a description thereof is omitted.

In the embodiment of FIG. 11, as compared with the FIG. 10 embodiment, the exposure light path from the bottom end of the projection optical system 13 to the wafer is placed outside the gas-replaced environment and inside the temperature controlled chamber 98. Thus, the housing 6, the reticle chamber 91, the outer casing 24 and the barrel base 22 are connected with each other while securing the gas tightness. Further, they are unified to provide a chamber which defines a closed space as depicted by a dot pattern B in the drawing.

As regards the gas flow inside the dot pattern area B, since it is similar to that of the FIG. 10 embodiment, a description thereof is omitted.

In this embodiment, in the air circulation system 1001, the circulation air is distributed to air outlet ports 1009a and 1009b at a predetermined flow rate distribution proportion. The outlet port 1009a directs the circulation air to the down-flow duct 76, as in the FIG. 10 embodiment. The outlet port 1009b is connected to the partial duct 23 at the wafer side, through a pipe 1011. The temperature of the air blown from the partial duct 23 is detected by a thermometer 77d provided adjacent to the wafer stage 15 or adjacent to the discharging port of the partial duct. In accordance with the result of the detection and in response to a signal from control means 1007, heaters 1006a and 1006b are controlled, whereby a predetermined temperature is accomplished.

The load-lock chamber 36 shown in FIG. 10 may not be used in this embodiment. Thus, as compared with the embodiments of FIGS. 1 and 10, this embodiment has an advantage with respect to the apparatus throughput and, additionally, the structure can be made simple.

As regards the light path from the bottom and of the projection optical system 13 to the wafer 14, the last optical element (not shown) inside the projection optical system 13 is disposed in proximity to the wafer 14 surface (about a few microns to a few hundred microns), while preventing adverse influence of light absorption to the apparatus performance.

In this embodiment, like the preceding embodiment, vacuum evacuation may be done for the gas replacement of the dot pattern area B. However, since, in the vacuum evacuation, the last optical element of the projection optical system 13 functions as a partition between the vacuum environment and the atmosphere environment, the optical element should have a sufficient strength to avoid breakage of the same as a matter of course, and also to prevent adverse influence on the optical performance resulting from any deformation of the same by repeated vacuum application.

The exposure apparatus of the present invention may be a step-and-repeat type exposure apparatus (called a stepper), in which a reticle pattern is printed sequentially in combination with stepwise motion, or a step-and-scan type exposure apparatus in which a reticle and a wafer are scanningly exposed in synchronism with each other, followed by sequential stepwise motion to move to a next shot.

In this embodiment, the gas discharged from the partial duct 23 is temperature controlled air. However, the invention is not limited to this. An inactive gas may be used. On that occasion, the purity of the inactive gas discharged from the partial duct 23 may be lower than that of the inactive gas in the dot pattern area B. The inactive gas used in the dot pattern area B may be introduced into the partial duct 23 for reuse of it. Further, when a helium gas is used as a purge gas of the dot pattern area B, and if helium is used also for the gas to be supplied to the chamber 98 and to the wafer peripheral portion from the partial duct 23, a large quantity of helium gas is required. In consideration of this, nitrogen may be used in place of helium.

Embodiment of A Semiconductor Manufacturing System

Next, an embodiment of a manufacturing system for manufacturing semiconductor devices such as semiconductor chips (e.g., ICs or LSIs), liquid crystal panels, CCDs, thin film magnetic heads, or micro-machines, for example, will be described. This system is arranged so that repair of any disorder occurring in a production machine in a semiconductor manufacturing factory or periodic maintenance thereof or, alternatively, maintenance service such as software supply can be made by use of a computer network outside the manufacturing factory.

Figure 12:
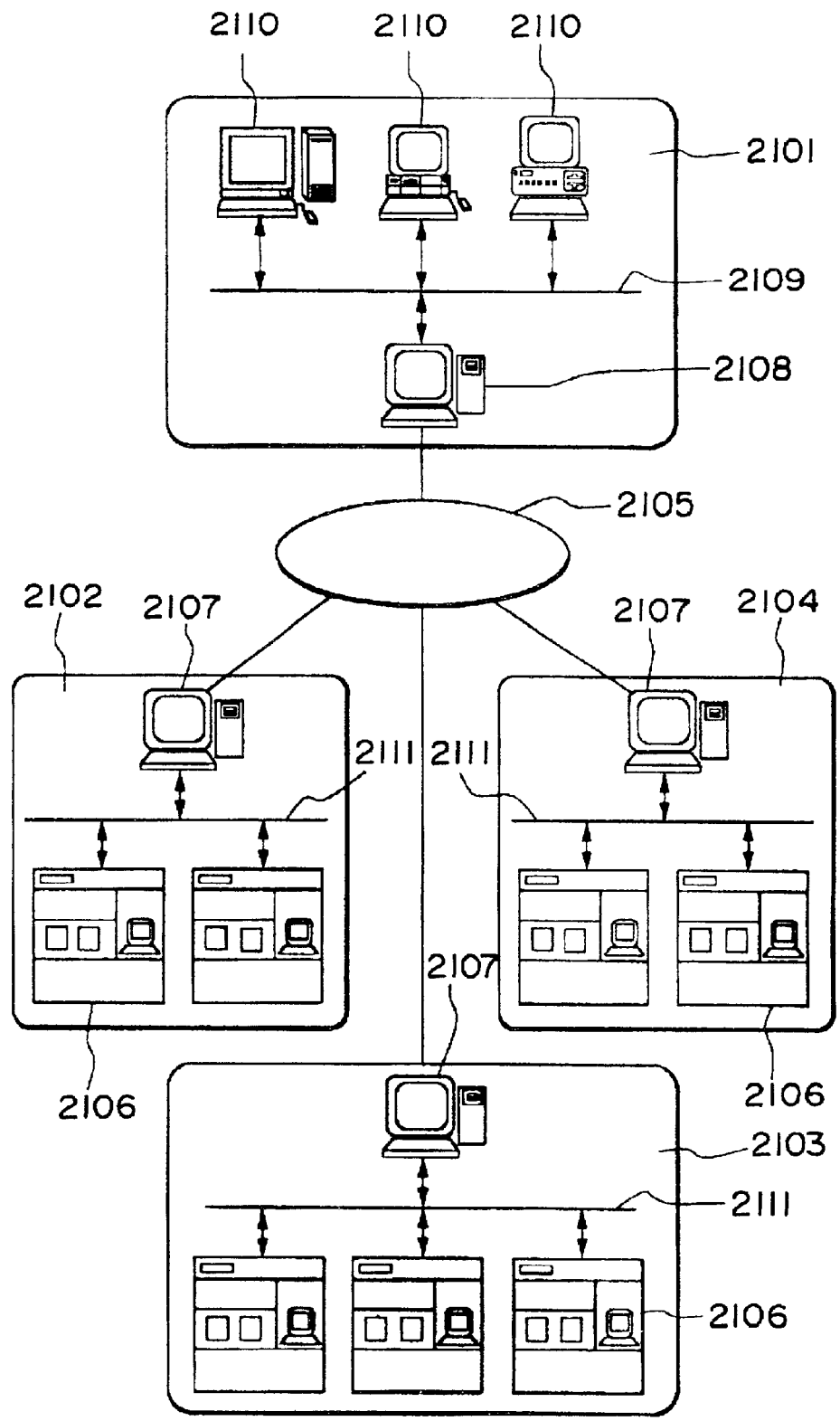
FIG. 12 is a schematic view of a general system of a computer network.

FIG. 12 is a schematic view of a general structure of the production system, in a certain aspect thereof. Denoted in the drawing at 2101 is a business office of a vendor (e.g., a machine supplying maker) for providing semiconductor device manufacturing apparatuses. As examples of such production machines, here, pre-process machines (e.g., various lithographic apparatuses such as an exposure apparatus, a resist coating apparatus, an etching apparatus, for example, and heat treatment apparatuses, film forming apparatuses, and flattening apparatus ) and post-process machines (e.g., assembling machines or inspection machines, for example) are expected. Inside the business office 2101, there are a host control system 2108 for providing a maintenance database for the production machine, plural operating terminal computers 2110, and a local area network (LAN) 2109 for connecting these computers to constitute an internet. The host control system 2108 is provided with a gateway for connecting the LAN 2109 to an internet 2105, which is an outside network of the office, and a security function for restricting the access from the outside.

On the other hand, denoted at 2102–2104 are manufacturing factories of a semiconductor manufacturer or manufacturers as a user (users) of production machines. The factories 2102–2104 may be those belonging to different manufacturers or the same manufacturer (e.g., a pre-process factory and a post-process factory). In each of the factories 2101–2104, there are production machines 2106, a local area network (LAN) 2111 for connecting them to constitute an intranet, and a host control system 2107 as a monitoring system for monitoring the state of operation of the production machines 2106. The host control system 2107 in each factory 2102–2104 is provided with a gateway for connecting the LAN 2111 in the factory to the internet 2105, which is an outside network of the factory. With this structure, the host control system 2108 of the vendor 2101 can be accessed from the LAN 2111 in each factory, through the internet 2105. Through the security function of the host control system 2108, only admitted users can gain access thereto. More specifically, through the internet 2105, status information representing the state of operation of the production machines 2106 (for example, the state of the machine in which any disorder has occurred) may be transmitted as a notice from the factory to the vendor. Additionally, response information responsive to the notice (for example, information on how the disorder should be treated or software data concerning the treatment) as well as latest software and maintenance information such as help information may be supplied from the vendor. The data communication between each factory 2102–2104 and the vendor 2101, as well as the data communication through the LAN 2111 in each factory, may use a communication protocol (TCP/IP) generally used in the internet. In place of using the internet, an exclusive line network (e.g., an ISDN) having higher security in which no third party can access, may be used. Further, the host control system is not limited to the system as provided by the vendor. A database may be structured by the user and set in an outside network, such that it can be accessed from plural user factories.

Figure 13:
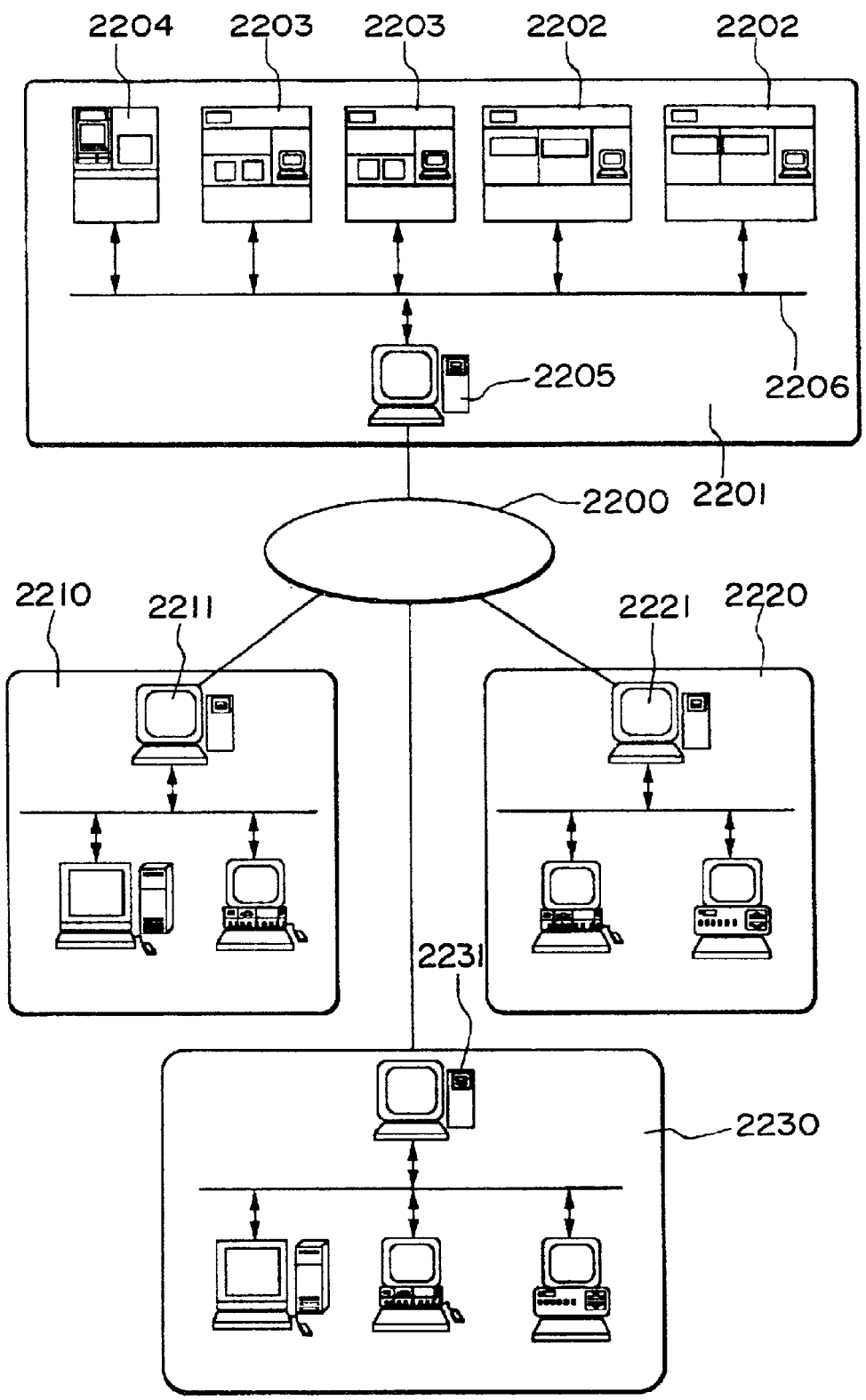
FIG. 13 is a schematic view of a general system of a computer network.

FIG. 13 is a schematic view of the general structure of the production system according to this embodiment, in another aspect thereof different from FIG. 12. In the preceding example, plural user factories each having production machines and the control system of the vendor of the production machine are connected through an external network, so that, through this external network, information related to the production control in each factory or related to at least one production machine is data communicated. In this example, as compared therewith, a factory having production machines from different vendors and control systems of these vendors corresponding to the user production machines are connected with each other through an external network outside the factory, so that maintenance information for these production machines is data communicated.

Denoted in the drawing at 2201 is a manufacturing factory of a production machine user (e.g., a semiconductor device manufacturer). Along the production line in the factory, there are many production machines for performing various processes, that is, in this example, exposure apparatus 2201, resist processing apparatus 2203, and film formation processing apparatus 2204 introduced. Although in the drawing only one factory is illustrated, in practice, plural factories may be arranged into the network. Each production machine in the factory is connected through a LAN 2206 to constitute an intranet. The operation of the production line is controlled by a host control system 2205.

On the other hand, in the business offices of vendors (e.g., a machine supplying maker), such as an exposure apparatus manufacturer 2210, a resist processing machine manufacturer 2220, and a film forming machine manufacturer 2230, for example, there are host control systems 2211, 2221 and 2231 for performing a remote control maintenance of the machines supplied by them. Each of these host control systems is equipped with a maintenance database and a gateway for the outside network. The host control system 2205 for controlling machines in the user factory and the control systems 2211, 2221 and 2231 of the machine vendors are connected with each other through the external network 2200 (internet) or an exclusive line network. If, in this production system, a disorder occurs in any one of the production machines in the production line, the operation of the production machine is stopped. However, this can be met quickly through the remote control maintenance of the disordered machine from the machine vendor by way of the internet 2200. Therefore, the suspension of the production line can be made minimum.

Each of the production machines in the factory may have a display, a network interface and a computer for executing network accessing software stored in a storage device as well as machine operating software. The storage device may be a memory or a hard disk or, alternatively, a network file server. The network accessing software may include an exclusive or wide-use web browser, and a user screen interface such as shown in FIG. 14, for example, is provided on the display. Various information may be inputted into the computer (input items on the screen) by an operator or operators who control the production machines in the factory, such as, for example, machine type (2401), serial number (2402), trouble file name (2403), date of disorder (2404), emergency level (2405), status (2406), solution or treatment (2407), and progress (2408). The thus inputted information is transmitted to the maintenance database through the internet. In response, appropriate maintenance information is replied from the maintenance database to the user display. Further, the user interface as provided by the web browser enables a hyperlink function (2410–2412) as illustrated. As a result, the operator can access further details of information in each item, can get latest version software to be used for the production machine, from the software library provided by the vendor, or can get an operation guide (help information) for the factory operators. Here, the maintenance information as provided by the maintenance control system may include information related to the replacement of purifiers or the maintenance thereof, as described hereinbefore. Further, the software library described above may provide latest software for specifying the timing for the purifier replacement or maintenance. Furthermore, the software library may support the ambience control inside the chamber as described hereinbefore.

Next, a semiconductor device manufacturing process, which uses the production system described above, will be explained.

Figure 15:
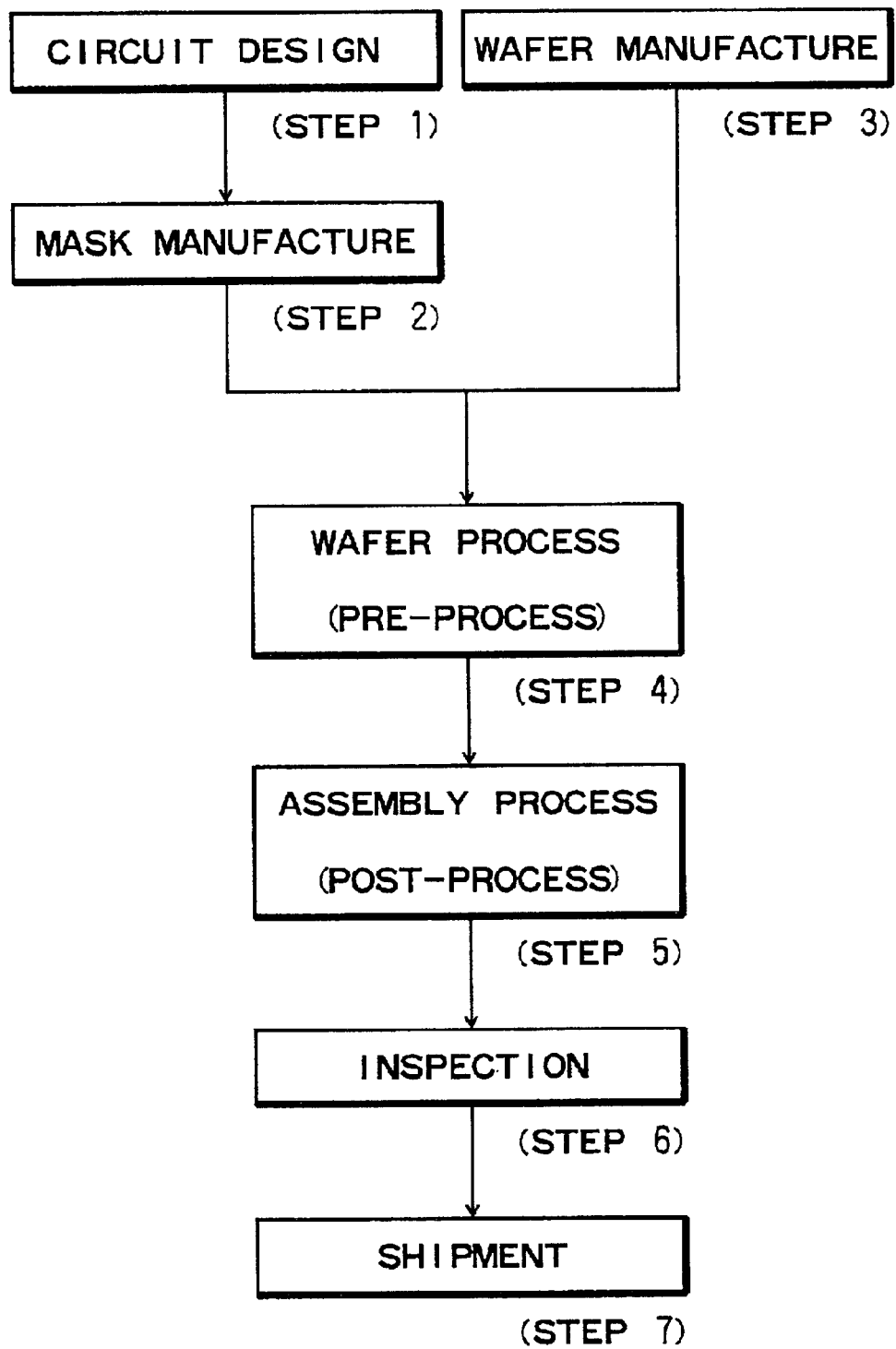
FIG. 15 is a flow chart of semiconductor device manufacturing processes.

FIG. 15 is a flow chart of a general procedure for manufacturing semiconductor devices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a preprocess) wherein, by using the so prepared mask and wafer, circuits are practically formed on the wafer through lithography. Step 5 subsequent to this is an assembling step (called a postprocess) wherein the wafer having been processed by step 4 is formed into semiconductor chips. This step includes an assembling (dicing and bonding) process and a packaging (chip sealing) process. Step 6 is an inspection step wherein an operation check, a durability check, and so on for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication of information related to the production control and machine maintenance may be done through the internet or an exclusive line network.

Figure 16:
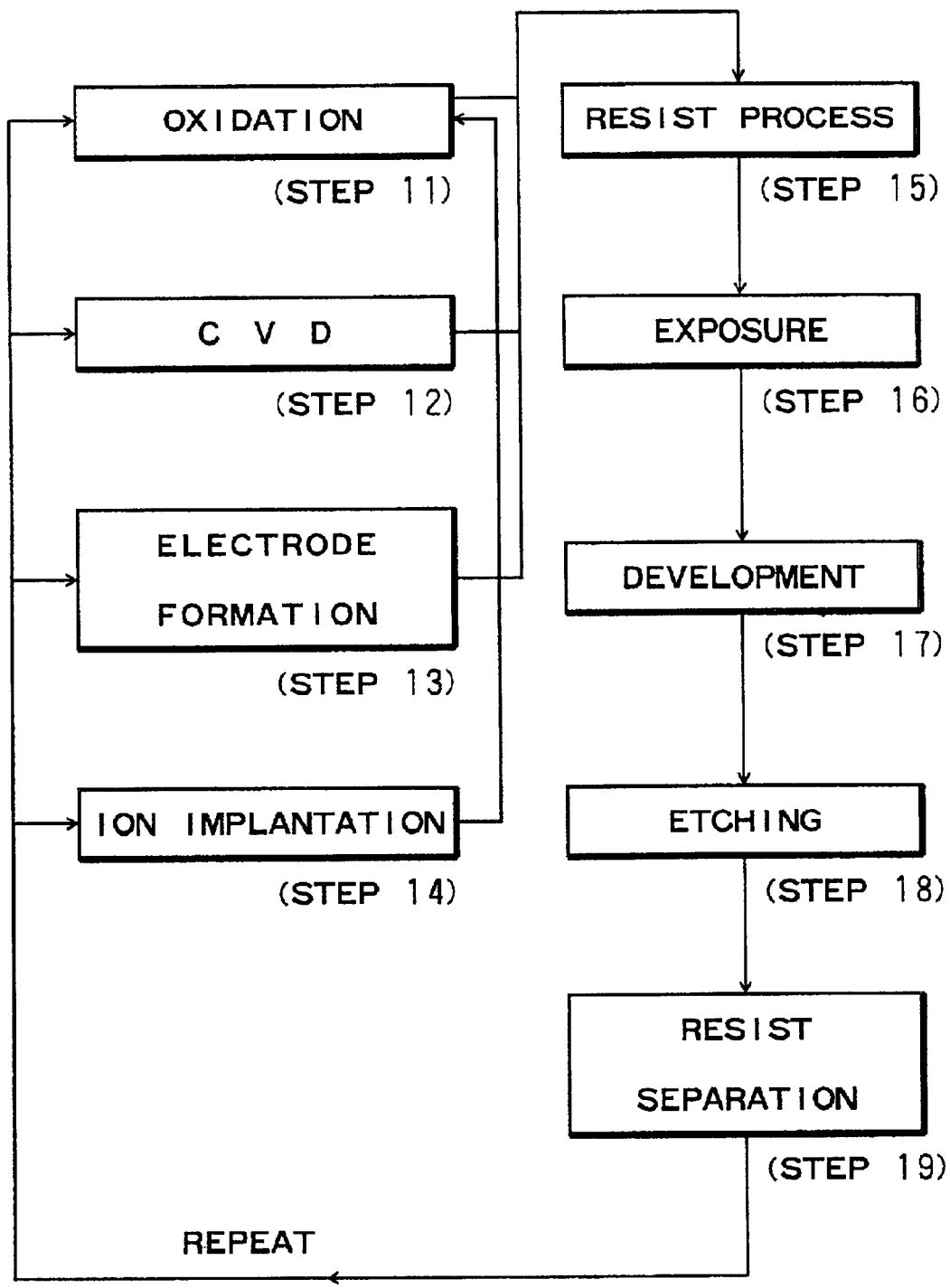
FIG. 16 is a flow chart for explaining details of a wafer process.

FIG. 16 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (e.g., a photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, disorders may be prevented beforehand. If a disorder occurs, it can be met quickly. Therefore, the device productivity can be improved significantly.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus to be used with an excimer laser as a light source, said apparatus comprising:
    an optical system disposed along a path of excimer laser light;
    a chamber for accommodating said optical system therein and having an inside space being able to be replaced by a predetermined gas;
    a gas circulation mechanism having a gas circulation path for connecting a gas discharging port for discharging a gas from said chamber and a gas supplying port for supplying a gas into said chamber; and
    switching means for selectively using plural purifiers disposed in the gas circulation path.

2. An apparatus according to claim 1, wherein said purifiers are disposed in parallel to each other in a portion of the gas circulation path.

3. An apparatus according to claim 1, further comprising a switching valve for selectively flowing the gas to one of upstream and downstream of said purifiers, and for selectively flowing the gas to any one of said purifiers.

4. An apparatus according to claim 3, wherein said valve is operable to shut the gas flow to at least one purifier.

5. An apparatus according to claim 4, wherein said valve is operable to shut the gas flow to a purifier, which (i) is to be replaced by another or (ii) needs maintenance.

6. An apparatus according to claim 3, wherein said valve is operable in response to a signal from a control system.

7. An apparatus according to claim 1, further comprising a gas supply source for supplying a gas to said purifier, and a gas discharging mechanism for discharging gas from said purifier.

8. An apparatus according to claim 7, wherein, on the basis of said switching means, a gas from said gas supply source is supplied to said purifier to which no gas is supplied from said chamber, and wherein, on the basis of said gas discharging mechanism, the gas is discharged from said purifier.

9. An apparatus according to claim 7, further comprising a second valve for opening and closing a flowpassage between said gas supply source and said purifier.

10. An apparatus according to claim 7, wherein said gas supply source supplies an inactive gas to said purifier.

11. An apparatus according to claim 10, wherein the inactive gas is one of helium and nitrogen.

12. An apparatus according to claim 7, wherein the supply of gas from said gas supply source is performed after (i) replacement of said purifier or (ii) maintenance of said purifier.

13. An apparatus according to claim 7, wherein introduction of a gas of said chamber to said purifier is initiated in accordance with one of a gas flowing time of said gas supply source and an output of a gas detector.

14. An exposure apparatus to be used with an excimer laser as a light source, said apparatus comprising:
an optical system disposed along a path of excimer laser light;
a chamber for accommodating said optical system therein and having an inside space being able to be replaced by a predetermined gas;
a gas circulation mechanism having a gas discharging port for discharging a gas from said chamber and a gas supply port for supplying a gas into said chamber;
switching means for selectively using plural purifiers disposed in a portion of a gas circulation path; and
a bypass way for circulating the gas inside said chamber, without passing through said purifier.

15. An apparatus according to claim 14, further comprising a third valve for changing flowpassages to said bypass way and said purifier.

16. An apparatus according to claim 14, wherein said bypass way is used at least when said apparatus is started.

17. An apparatus according to claim 1, wherein the gas from said purifier is supplied to a supply port while being temperature controlled.

18. An apparatus according to claim 1, wherein said purifier has a function for removing oxygen.

19. An apparatus according to claim 1, wherein said purifier has a function for removing ozone.

20. An apparatus according to claim 1, wherein said purifier has a chemical filter.

21. An apparatus according to claim 20, wherein said chemical filter is effective to remove an organic gas.

22. An exposure apparatus to be used with an excimer laser as a light source, said apparatus comprising:
first and second chambers for maintaining a predetermined gas ambience at a path of excimer laser light, wherein said first chamber has an optical integrator and said second chamber is adapted to enclose a masking blade for defining an illumination range on a reticle; and
an optical member for spatially separating said first and second chambers from each other, and being transmissive to the excimer laser light,
wherein said optical member contains a fluorine compound glass.

23. An exposure apparatus to be used with an excimer laser as a light source, said apparatus comprising:
first and second chambers for maintaining a predetermined gas ambience at a path of excimer laser light, wherein said first chamber has an optical integrator;
an optical member for spatially separating said first and second chambers from each other, and being transmissive to the excimer laser light, wherein said optical member contains a fluorine compound glass; and
a half mirror disposed between said optical integrator and said fluorine compound glass, wherein light reflected by said half mirror is detected to determine the light quantity.

24. An apparatus to be used with an excimer laser as a light source, said apparatus comprising:
first and second chambers for maintaining a predetermined gas ambience at a path of excimer laser light, wherein said second chamber is adapted to enclose a masking blade for defining an illumination range on a reticle; and
an optical member for spatially separating said first and second chambers from each other, and being transmissive to the excimer laser light,
wherein said optical member contains a fluorine compound glass, wherein the fluorine compound glass uses one of $CaF_2$, $MgF_2$, $SrF_2$ and fluorine doped quartz.

25. An exposure apparatus comprising:
an optical system, having a plurality of optical elements, including a reflection member for deflecting an optical axis of said optical system, and a plurality of refraction members; and
gas supplying means for supplying a gas to a space separated by the plurality of optical elements, wherein, in a space separated by two refraction members of said plurality of refraction members and containing said reflection member, a line connecting a vent hole for supplying a gas to the space and a vent hole for discharging the gas from the space intersects an optical axis of said optical system, as viewed from a direction orthogonal to the optical axes of said two refraction members.

26. An apparatus according to claim 25, wherein the line intersects the optical axis of said optical system twice, as viewed from a direction-orthogonal to the optical axes of said two refraction members.

27. An apparatus according to claim 25, wherein the gas is an inactive gas.

28. An apparatus according to claim 25, wherein the inactive gas is one of nitrogen gas and helium gas.

29. An apparatus according to claim 25, wherein the light source emits light of a wavelength in a vacuum ultraviolet region.

30. An apparatus according to claim 25, wherein the light source comprises one of an $F_2$ laser and an $Ar_2$ laser.

31. An apparatus according to claim 25, wherein said optical system is at least one of an illumination optical system and a projection optical system.

32. An apparatus according to claim 25, wherein said optical system includes one of a catadioptric system and a catoptric system.

33. A device manufacturing method, comprising the steps of:
   providing an exposure apparatus as recited in claim 1;
   applying a photosensitive material to a wafer;
   exposing the wafer by use of the exposure apparatus; and
   developing the exposed wafer.

34. A semiconductor manufacturing factory, comprising:
   a production machine group including an exposure apparatus as recited in claim 1;
   a local area network for connecting the production machine group; and
   a gateway for enabling access from the local area network to an external network outside said factory,
   wherein information related to at least one production machine in said production machine group is data communicated.

35. A maintenance method for an exposure apparatus as recited in claim 1 and being placed in a semiconductor manufacturing factory, said method comprising the steps of:
   preparing a maintenance database connected to an outside network of the factory, wherein the database can be prepared by a user or a vendor of the exposure apparatus;
   admitting access to the maintenance database through the outside network, from the factory; and
   transmitting maintenance information stored in the maintenance database to the factory through the outside network.

36. A device manufacturing method, comprising the steps of:
   providing an exposure apparatus as recited in claim 14;
   applying a photosensitive material to a wafer;
   exposing the wafer by use of the exposure apparatus; and
   developing the exposed wafer.

37. A semiconductor manufacturing factory, comprising:
   a production machine group including an exposure apparatus as recited in claim 14;
   a local area network for connecting the production machine group; and
   a gateway for enabling access from the local area network to an external network outside said factory,
   wherein information related to at least one production machine in said production machine group is data communicated.

38. A maintenance method for an exposure apparatus as recited in claim 14 and being placed in a semiconductor manufacturing factory, said method comprising the steps of:
   preparing a maintenance database connected to an outside network of the factory, wherein the database can be prepared by a user or a vendor of the exposure apparatus;
   admitting access to the maintenance database through the outside network, from the factory; and
   transmitting maintenance information stored in the maintenance database to the factory through the outside network.

39. A device manufacturing method, comprising the steps of:
   providing an exposure apparatus as recited in claim 22;
   applying a photosensitive material to a wafer;
   exposing the wafer by use of the exposure apparatus; and
   developing the exposed wafer.

40. A semiconductor manufacturing factory, comprising:
   a production machine group including an exposure apparatus as recited in claim 22;
   a local area network for connecting the production machine group; and
   a gateway for enabling access from the local area network to an external network outside said factory,
   wherein information related to at least one production machine in said production machine group is data communicated.

41. A maintenance method for an exposure apparatus as recited in claim 22 and being placed in a semiconductor manufacturing factory, said method comprising the steps of:
   preparing a maintenance database connected to an outside network of the factory, wherein the database can be prepared by a user or a vendor of the exposure apparatus;
   admitting access to the maintenance database through the outside network, from the factory; and
   transmitting maintenance information stored in the maintenance database to the factory through the outside network.

42. A device manufacturing method, comprising the steps of:
   providing an exposure apparatus as recited in claim 23;
   applying a photosensitive material to a wafer;
   exposing the wafer by use of the exposure apparatus; and
   developing the exposed wafer.

43. A semiconductor manufacturing factory, comprising:
   a production machine group including an exposure apparatus as recited in claim 23;
   a local area network for connecting the production machine group; and
   a gateway for enabling access from the local area network to an external network outside said factory,
   wherein information related to at least one production machine in said production machine group is data communicated.

44. A maintenance method for an exposure apparatus as recited in claim 23 and being placed in a semiconductor manufacturing factory, said method comprising the steps of:
   preparing a maintenance database connected to an outside network of the factory, wherein the database can be prepared by a user or a vendor of the exposure apparatus;
   admitting access to the maintenance database through the outside network, from the factory; and
   transmitting maintenance information stored in the maintenance database to the factory through the outside network.

45. A device manufacturing method, comprising the steps of:
   providing an exposure apparatus as recited in claim 24;
   applying a photosensitive material to a wafer;
   exposing the wafer by use of the exposure apparatus; and
   developing the exposed wafer.

46. A semiconductor manufacturing factory, comprising:
   a production machine group including an exposure apparatus as recited in claim 24;
   a local area network for connecting the production machine group; and
   a gateway for enabling access from the local area network to an external network outside said factory,
   wherein information related to at least one production machine in said production machine group is data communicated.

47. A maintenance method for an exposure apparatus to be used with an excimer laser as a light source and being placed in a semiconductor manufacturing factory, said apparatus comprising (i) first and second chambers for maintaining a predetermined gas ambience at a path of excimer laser light, (ii) an optical member for spatially separating said first and second chambers from each other, and being transmissive to the excimer laser light, wherein said optical member contains a fluorine compound glass, and (iii) a third chamber for enclosing at least one of said first and second chambers, said method comprising the steps of:

preparing a maintenance database connected to an outside network of the factory, wherein the database can be prepared by a user or a vendor of the exposure apparatus;

admitting access to the maintenance database through the outside network, from the factory; and transmitting maintenance information stored in the maintenance database to the factory through the outside network.

48. A maintenance method for an exposure apparatus to be used with an excimer laser as a light source and being placed in a semiconductor manufacturing factory, said apparatus comprising (i) first and second chambers for maintaining a predetermined gas ambience at a path of excimer laser light, and (ii) a movable member for connecting said first and second chambers with each other, to secure gas tightness and to enable absorption of relative displacement between said first and second chambers, said method comprising the steps of:

preparing a maintenance database connected to an outside network of the factory, wherein the database can be prepared by a user or a vendor of the exposure apparatus;

admitting access to the maintenance database through the outside network, from the factory; and transmitting maintenance information stored in the maintenance database to the factory through the outside network.

49. A device manufacturing method, comprising the steps of:

providing an exposure apparatus as recited in claim 25;
applying a photosensitive material to a wafer;
exposing the wafer by use of the exposure apparatus; and
developing the exposed wafer.

50. A semiconductor manufacturing factory, comprising:
a production machine group including an exposure apparatus as recited in claim 25;
a local area network for connecting the production machine group; and
a gateway for enabling access from the local area network to an external network outside said factory,
wherein information related to at least one production machine in said production machine group is data communicated.

51. A maintenance method for an exposure apparatus being placed in a semiconductor manufacturing factory and comprising (i) an optical system, having a plurality of optical elements, including a reflection member for deflecting an optical axis of said optical system, and a plurality of refraction members, and (ii) gas supplying means for supplying a gas to a space separated by the plurality of optical elements, wherein, in a space separated by two refraction members of said plurality of refraction members and containing said reflection member, a line connecting a vent hole for supplying a gas to the space and a vent hole for discharging the gas from the space intersects an optical axis of said optical system, as viewed from a direction orthogonal to the optical axes of said two refraction members, said method comprising the steps of:

preparing a maintenance database connected to an outside network of the factory, wherein the database can be prepared by a user or a vendor of the exposure apparatus;

admitting access to the maintenance database through the outside network, from the factory; and transmitting maintenance information stored in the maintenance database to the factory through the outside network.

* * * * *

UNITED STATES PATENT AND TRADEMARK OFFICE
CERTIFICATE OF CORRECTION

PATENT NO.   : 6,829,034 B2
DATED        : December 7, 2004
INVENTOR(S)  : Yoshinori Miwa et al.

It is certified that error appears in the above-identified patent and that said Letters Patent is hereby corrected as shown below:

Column 4,
Line 5, "of fluoride" should read -- of calcium fluoride --.

Column 5,
Line 7, "Air-filter)" should read -- Air filter) --.

Column 8,
Line 60, "form" should read -- from --.

Column 11,
Line 31, "highhumidity" should read -- high-humidity --.

Column 12,
Line 17, "1002" should read -- 102 --.

Column 22,
Line 60, "other" should read -- other, --.

Column 24,
Line 51, "direction-orthogonal" should read -- direction orthogonal --.

Signed and Sealed this

Twenty-third Day of August, 2005

JON W. DUDAS
*Director of the United States Patent and Trademark Office*